(12) United States Patent
Bendimerad et al.

(10) Patent No.: US 8,895,348 B2
(45) Date of Patent: Nov. 25, 2014

(54) METHODS OF FORMING A HIGH EFFICIENCY SOLAR CELL WITH A LOCALIZED BACK SURFACE FIELD

(71) Applicant: Innovalight, Wilmington, DE (US)

(72) Inventors: Karim Lofti Bendimerad, San Francisco, CA (US); Daniel Aneurin Inns, Sunnyvale, CA (US); Dmitry Poplavskyy, San Jose, CA (US)

(73) Assignee: Innovalight Inc

( * ) Notice: Subject to any disclaimer, the term of this patent is extended or adjusted under 35 U.S.C. 154(b) by 150 days.

(21) Appl. No.: 13/687,126

(22) Filed: Nov. 28, 2012

(65) Prior Publication Data

US 2013/0153019 A1   Jun. 20, 2013

Related U.S. Application Data

(60) Provisional application No. 61/577,901, filed on Dec. 20, 2011.

(51) Int. Cl.
*H01L 21/00* (2006.01)
*H01L 31/0216* (2014.01)
*H01L 31/18* (2006.01)
*H01L 31/068* (2012.01)

(52) U.S. Cl.
CPC .......... *H01L 31/02168* (2013.01); *H01L 31/18* (2013.01); *H01L 31/068* (2013.01); *H01L 31/1804* (2013.01); *Y02E 10/547* (2013.01)
USPC ............. 438/72; 438/514; 438/542; 438/556; 438/597; 257/E21.162; 257/E21.313

(58) Field of Classification Search
CPC .............. H01L 31/02168; H01L 31/18; H01L 31/1804; H01L 31/068
USPC .......................... 438/72, 514, 542, 556, 597; 257/E27.125, E21.162, E21.313; 136/256
See application file for complete search history.

(56) References Cited

U.S. PATENT DOCUMENTS

| | | | |
|---|---|---|---|
| 2005/0126627 A1* | 6/2005 | Hayashida | 136/257 |
| 2005/0268963 A1* | 12/2005 | Jordan et al. | 136/256 |
| 2009/0173379 A1* | 7/2009 | Kim | 136/256 |
| 2010/0167510 A1 | 7/2010 | Kelman et al. | |
| 2011/0003465 A1 | 1/2011 | Scardera et al. | |
| 2011/0183504 A1 | 7/2011 | Scardera et al. | |
| 2011/0300697 A1* | 12/2011 | Kohira et al. | 438/546 |

OTHER PUBLICATIONS

U.S. Appl. No. 13/099,794, filed May 3, 2011, Kelman et al.

(Continued)

*Primary Examiner* — Michelle Mandala

(57) ABSTRACT

A solar cell, comprising: a doped silicon substrate, the silicon substrate comprising a front surface and a rear surface; a front phosphorous diffusion layer formed on the front surface; a front anti-reflective layer formed on the front phosphorous diffusion layer; a front metal electrode on the front surface in ohmic contact with the front phosphorous diffusion layer through the front anti-reflective layer; a rear passivation layer formed on the rear surface; a rear metal electrode in a pattern on the rear surface passing through the rear passivation layer; and a rear p+ diffusion area on the rear surface between the rear passivation layer and a boron-doped region of the silicon substrate, the rear p+ diffusion area surrounding the rear metal electrode.

16 Claims, 16 Drawing Sheets

(56) References Cited

OTHER PUBLICATIONS

P. P. Altermatt, et al., Rear Surface Passivation of High Efficiency Silicon Solar Cells by a Floating Junction, J. Appl. Phys., vol. 80 (6), Sep. 1996, pp. 3574-3586.

E. Bassous, et al., Highly Selective KOH-Based Etchant for Boron-Doped Silicon Structures, IBM Research Division, Thomas J. Watson Research Center, Yorktown Heights, NY 10598, USA, Microelectronic Engineering, vol. 9 (1989) pp. 167-170.

A. W. Blakers, et al 22.8% Efficient Silicon Solar Cell, Applied Physics, Letters, vol. 55 (1989), pp. 1363-1365.

S. Dauwe, et al.. Experimental Evidence of Parasitic Shunting in Silicon Nitride Rear Surface Passivated Solar Cells, Progress in Photovoltaics: Research and Applications, Prog. Photovolt: Res. Appl. 2002, vol. 10, pp. 271-278.

C. B. Honsberg, et al., 685 mV Open-Circuit Voltage Laser Grooved Silicon Solar Cell, Solar Energy Materials and Solar Cells, vol. 34 (1994), pp. 117-123.

K. J. Hubbard, et al., Thermodynamic Stability of Binary Oxides in Contact with Silicon, J. Mater. Research, vol. 11 No. 11, Nov. 1996, pp. 2757-2776.

A. Wang, et al., 24% efficient silicon solar cells, J. Appl. Phys. Lett., vol. 57, 602 (Aug. 6, 1990), pp. 601-604.

\* cited by examiner

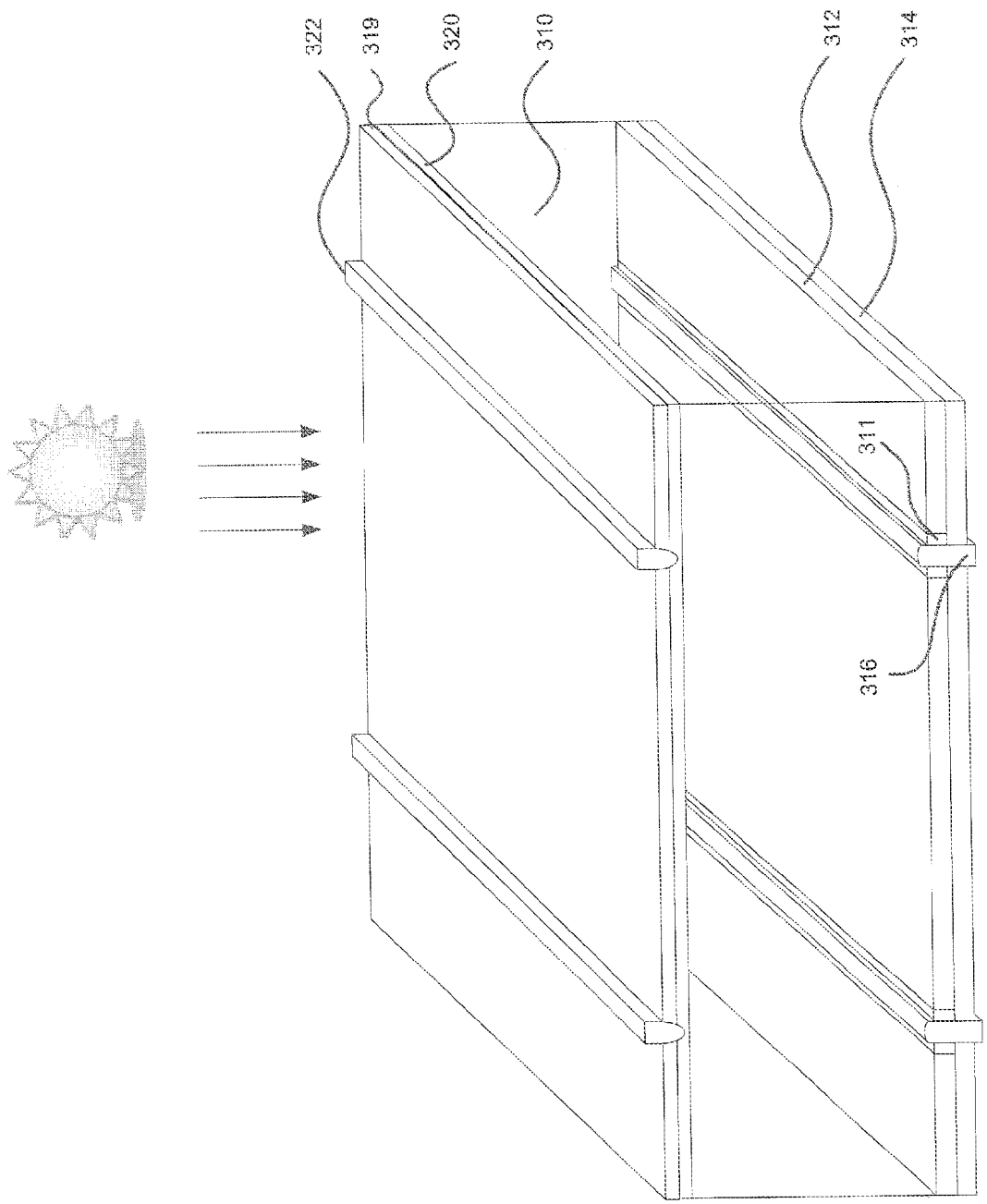

METHODS OF FORMING A HIGH EFFICIENCY SOLAR CELL WITH A LOCALIZED BACK SURFACE FIELD

FIELD OF THE INVENTION

This disclosure relates in general to p-n junctions and in particular to methods of forming a high efficiency solar cell with a localized back surface field.

TECHNICAL BACKGROUND OF THE INVENTION

A solar cell converts solar energy directly to DC electric energy. Generally configured as a photodiode, it permits light to penetrate into the vicinity of metal electrodes (metal contacts) such that a generated charge carrier (electrons or holes (a lack of electrons)) may be extracted as current. And like most other diodes, photodiodes are formed by combining p-type and n-type semiconductors to form a junction.

Electrons on the p-type side of the junction within the electric field (or built-in potential) may then be attracted to the n-type region (usually doped with phosphorous) and repelled from the p-type region (usually doped with boron), whereas holes within the electric field on the n-type side of the junction may then be attracted to the p-type region and repelled from the n-type region. Generally, the n-type region and/or the p-type region can each respectively be comprised of varying levels of relative dopant concentration, often shown as n−, n+, n++, p−, p+, p++, etc. The built-in potential and thus magnitude of electric field generally depend on the level of doping between two adjacent layers.

Most solar cells are generally formed on a silicon substrate doped with a first dopant (commonly boron) forming an absorber region, upon which a second counter dopant (commonly phosphorous) is diffused forming the emitter region, in order to complete the p-n junction. After the addition of passivation, back surface field (BSF), and antireflection coatings, metal electrodes (fingers and busbar on the emitter and pads on the back of the absorber) may be added in order to extract generated charge. The BSF, in particular, must be optimized for both carrier collection and for contact with the metal electrodes.

Referring to FIG. 1, a simplified diagram of a traditional front-contact solar cell is shown. In a common configuration, a phosphorous-doped (n-type) emitter region 108 is first formed on a boron-doped silicon substrate 110 (p-type, although a configuration with a boron-doped emitter region on a phosphorus-doped silicon substrate may also be used).

Prior to the deposition of silicon nitride ($SiN_x$) layer 104 on the front of the silicon substrate, residual surface glass (PSG) formed on the silicon substrate surface during the $POCl_3$ deposition process may be removed by exposing the doped silicon substrate to an etchant, such as hydrofluoric acid (HF). The set of metal electrodes, comprising front-metal electrode 102 and back surface field (BSF)/rear metal contact 116, are then sequentially formed on and subsequently fired into the substrate.

The front metal electrode 102 is commonly formed by depositing an Ag (silver) paste, comprising Ag powder (about 70 to about 80 wt % (weight percent)), glass frit (about 1 to about 10 wt %), and organic components (about 15 to about 30 wt %). After deposition the paste is dried at a tow temperature to remove organic solvents and fired at high temperatures to form the conductive metal layer and to enable the silicon-metal electrode.

BSF/rear metal contact 116 is generally formed from aluminum (in the case of a p-type silicon substrate) and is configured to create a potential barrier that repels and thus minimizes the impact of minority carrier rear surface recombination. In addition, Ag pads [not shown] are generally applied onto BSF/rear metal contract 116 in order to facilitate soldering for interconnection into modules.

However, the use of an aluminum BSF may also be problematic. An aluminum BSF tends to cause solar cell warping, which leads to difficulties in subsequent production processes and decreases the yield due to increased breakage. In addition, not only does an aluminum BSF tend to form a suboptimal reflection surface, reducing the amount of long wavelength light that would otherwise be reflected back into the wafer substrate, but it is also not generally the best form of rear passivation available.

One solution is to replace the aluminum BSF with a more reflective and better passivating layer and to further reduce the rear metal contact area. Consequently, charge carrier recombination at the back surface will tend to be reduced and the absorption of long wavelength light will tend to be increased.

Solar cells configured with this architecture are commonly referred to as PERC (Passivated Emitter and Rear Cell) an architecture that was first introduced in 1989 by the University of New South Wales [A. W. Blakers, et al., Applied Physics Letters, 55 (1989) 1363-1365]. The devices fabricated in that study used heavily doped substrates as well as numerous expensive processing steps that are not compatible with high throughput manufacturing. Other versions of this cell architecture were later introduced as options to further increase the efficiency. Most notable among them is the PERL (passivated emitter rear locally diffused) [A. Wang, et al. J. Appl. Phys. Lett. 57, 602, (1990)] and PERF (passivated emitter rear floating junction) cells [P. P. Altermatt, et al. J. Appl. Phys. 80 (6), September 1996, pp. 3574-3586]. Similar to the original PERC cell, these architectures are expensive to manufacture. Since their introduction there have been numerous attempts to develop an industrially viable approach to make these cells.

One important feature of these cells is the passivation layer on the rear surface. One approach is to use the residual rear phosphorous diffusion, created during the front-side phosphorous diffusion process (or in a separate diffusion step), provided it is disconnected from the front junction. This type of passivation is referred to as a rear diffused floating junction and has been shown to provide excellent quality rear passivation [C. B. Honsberg, Solar Energy Materials and Solar Cells 34, Issues 1-4, 1 Sep. 1994, Pages 117-123]. An alternative type of floating junction can be formed by putting a dielectric layer that contains fixed positive charge (e.g. silicon nitride) onto lightly p-type silicon (i.e. the wafer bulk). In this case the fixed charge creates an inversion layer in the silicon which serves to passivate the silicon surface in a similar way to an n-type diffusion. This case may be referred to as an induced floating junction.

Floating junctions provide excellent rear surface passivation, but are also generally susceptible to the formation of a shunt between the rear metal electrode and the counter-doped areas (floating junction) at the rear of the silicon substrate. This shunt path greatly reduces the passivation provided by the floating junction, resulting in reduced cell efficiency [S. Dauwe, et al, Prog. Photovolt: Res. Appl. 2002; 10:271-278].

Referring now to FIG. 2, a simplified diagram is shown of detrimental shunting in a rear metal reduced area solar cell configuration on a p-type (boron doped) substrate 210 with an n-type emitter layer. Here, a set of front metal electrodes 222 connects to n+ emitter region 220 through front surface SiNx layer 219 in order to make an ohmic contact. n+ emitter region 220 is generally formed with a POCl₃ diffusion process. SiNx layer 219 is generally configured to passivate the front surface as well as to minimize hot reflection from the top surface of the solar cell.

Likewise, the set of rear metal electrodes 216 connects with the p– bulk region 210 through back surface SiNx layer 214 in order to make an ohmic contact to the back-side of the cell. However, a residual n+ region 212, created during the POCl₃ process to form n+ emitter region 220, creates a shunting pathway for charge carrier 218, which can substantially reduce any generated current as well as the overall solar cell efficiency.

SUMMARY OF THE INVENTION

The invention relates, in one embodiment, to a method of forming a high efficiency solar cell, comprising steps of: (a) providing a doped silicon substrate, the substrate comprising a front surface and a rear surface; (b) depositing an ink on the rear surface in a pattern, the ink comprising a p-type dopant and a solvent; (c) heating the silicon substrate in a baking ambient to a first temperature and for a first time period in order to remove residual solvent from the deposited ink; (d) heating the silicon substrate in a diffusion ambient to a second temperature and for a second time period in order to diffuse the p-type dopant into the rear surface to form a rear p+ diffusion area on the rear surface; (e) exposing the silicon substrate to a phosphorous deposition ambient at a third temperature for a third time period, wherein a front PSG layer and a front phosphorous diffusion layer are formed on the front surface; (f) exposing the silicon substrate to an etchant for a third time period, wherein the front PSG layer is substantially removed; (g) depositing a front anti-reflective layer on the front surface and a rear passivation layer on the rear surface; and (h) forming a front metal electrode on the front surface in ohmic contact with the front phosphorous diffusion layer through the front anti-reflective layer and a rear metal electrode on the rear surface through the rear passivation layer, the rear metal electrode being formed on the rear p+ diffusion area on the rear surface.

The invention relates, in another embodiment, to a solar cell, comprising: a doped silicon substrate, the silicon substrate comprising a front surface and a rear surface; a front phosphorous diffusion layer formed on the front surface; a front anti-reflective layer formed on the front phosphorous diffusion layer; a front metal electrode on the front surface in ohmic contact with the front phosphorous diffusion layer through the front anti-reflective layer; a rear passivation layer formed on the rear surface; a rear metal electrode in a pattern on the rear surface passing through the rear passivation layer; and a rear p+ diffusion area on the rear surface between the rear passivation layer and a boron-doped region of the silicon substrate, the rear p+ diffusion area surrounding the rear metal electrode.

BRIEF DESCRIPTION OF THE DRAWINGS

The present invention is illustrated by way of example, and not by way of limitation, in the figures of the accompanying drawings and in which like reference numerals refer to similar elements and in which:

FIG. 3A shows a simplified 2-D lateral diagram of the front contact solar cell, whereas FIG. 3B shows a simplified isometric projection of the front contact solar cell.

FIG. 4A shows a simplified 2-D lateral diagram of the front contact solar cell, whereas

DETAILED DESCRIPTION OF THE INVENTION

Figure 1:
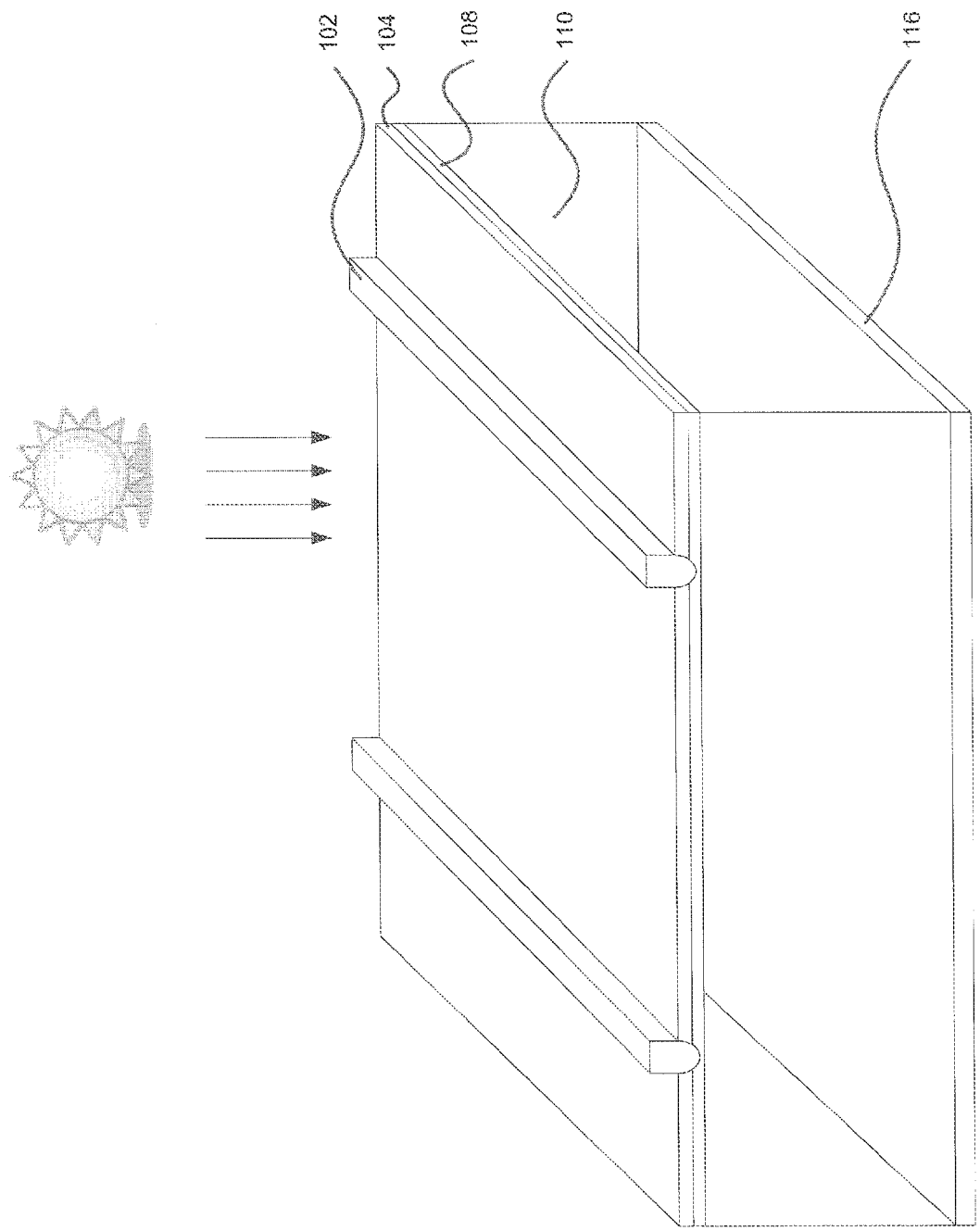
FIG. 1 shows a simplified diagram of a traditional front-contact solar cell.

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

As previously described, floating junctions (both diffused and induced) provide excellent rear surface passivation, but also generally form a shunt between the rear metal electrode and counter-doped areas at the rear of the silicon substrate created during front-side emitter formation. In an advantageous manner, a boron-containing doping paste may be used to form a highly doped p-type region around the set of rear metal electrode, such that the recombination of generated minority charge carriers is substantially reduced.

In the abovementioned configuration, a selective emitter may optionally be employed on the front surface, for example by using a silicon-containing nanoparticle ink in conjunction with a POCl₃ diffusion process as described in U.S. Publication US 2011/0183504 and U.S. Publication US 2011/0003465. In an embodiment, the silicon-containing nanoparticle ink comprises silicon nanoparticles dispersed in a solvent, forming a colloidal dispersion. The silicon nanoparticles may be doped or undoped. The particle size of the silicon nanoparticle is 1-100 nm in an embodiment. The silicon-containing nanoparticle ink is deposited on the front surface in a pattern prior to the process of phosphorous diffusion. The ink is heated to remove residual solvent from the deposited ink. The silicon-containing nanoparticle ink can be simultaneously heated together with the ink comprising the p-type dopant and the solvent so as to simplify the manufacturing process.

Alternatively a selective emitter could be formed using a variety of other known methods in the art including, but not limited to, laser doping, selective etch back and double diffusion.

In general, in order to diffuse phosphorous into a boron doped silicon substrate in a quartz tube furnace, $POCl_3$ (phosphorus oxychloride) is used. The reaction is typically:

$$4POCl_{3(g)} + 3O_{2(g)} \rightarrow 2P_2O_{5(l)} + 6Cl_{2(g)} \quad \text{[Equation 1A]}$$

$$2P_2O_{5(l)} + 5Si_{(s)} \rightarrow 5SiO_{2(s)} + 4P_{(s)} \quad \text{[Equation 1B]}$$

$$Si + O_2 \rightarrow SiO_2 \quad \text{[Equation 2]}$$

The typical gases involved in a $POCl_3$ diffusion process include a carrier nitrogen gas (carrier $N_2$ gas) which is flowed through a bubbler filled with liquid $POCl_3$, a reactive oxygen gas (reactive $O_2$ gas) configured to react with the vaporized $POCl_3$ to form the deposition (processing) gas, and optionally a main oxygen gas (main $O_2$ gas) configured to later form an oxide layer.

A silicon substrate is generally placed in a heated tube furnace with a nitrogen gas ambient (main $N_2$ gas). The deposition gas ($POCl_3$ vapor) is then flowed into the tube furnace, heated to a deposition temperature, and exposed to reactive $O_2$ (oxygen) gas to form $P_2O_5$ (phosphorus pentoxide) on the silicon substrate front and rear surface, as well as $Cl_2$ (chlorine) gas that interacts with and removes metal impurities in the silicon substrate. $P_2O_5$ in turn reacts with the silicon substrate to form $SiO_2$, and free P atoms. The simultaneous oxidation of the silicon wafer during the deposition results in the formation of a $SiO_2.P_2O_5$ layer (PSG or phosphosilicate glass).

An additional drive-in step (free of any $POCl_3$ flow) is typically employed using the deposition temperature or a higher temperature in order to enable the free phosphorous atoms to diffuse further into the silicon substrate and substitutionally replace silicon atoms in the lattice in order to be available for charge carrier generation. During this step, ambient gas which may comprise of main $N_2$ gas and/or main $O_2$ gas is flowed into the tube furnace.

The PSG would later be removed using an appropriate etchant, such as HF, the perimeter front substrate would be electrically isolated (for example by cutting a trench with a laser) from the rear surface in order to prevent shunting.

Figure 3A:
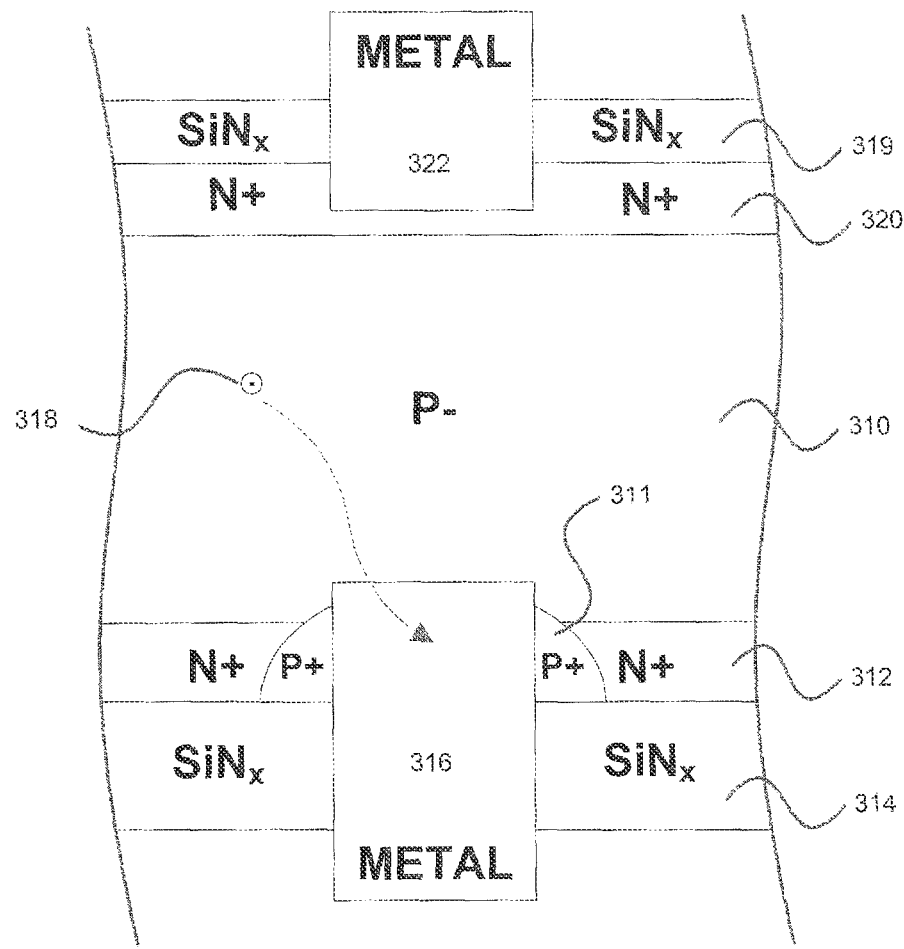

Referring now to FIGS. 3A-B, a set of diagrams is shown of a front contact solar cell in which a set of reduced area rear contacts are in direct contact with a p− substrate, in accordance with the invention. FIG. 3A shows a simplified 2-D lateral diagram of the front contact solar cell, whereas FIG. 3B shows a simplified isometric projection of the front contact solar cell.

On the front side, a set of front metal electrodes 322 connects to n+ emitter region 320 through front surface SiNx layer 319 in order to make an ohmic contact. n+ emitter region 320 is generally formed with a $POCl_3$ diffusion process. SiNx layer 319 is generally configured to passivate the front surface as well as to minimize light reflection from the top surface of the solar cell.

In an advantageous manner, a heavily doped p-type region 311 may be formed on the rear of p-type silicon substrate 310, such that the set of rear metal electrodes 316 connects with p+ region 311 (through back surface anti-reflective layer (typically, SiNx) 314) without direct contact to a residual n+ region 312. Consequently, since the shunting path through residual n+ region 312 has been removed, the recombination of minority charge carriers 318 is substantially reduced. In one configuration, the set of rear metal electrodes 316 comprise aluminum such that a localized aluminum BSF (Al-BSF) is formed. In an alternate configuration, p+ region 311 is formed of boron, while the set of rear metal electrodes 316 is formed from an alternate metal, such as silver or a silver aluminum mix. In the configuration of FIG. 3A, the rear metal electrode 316 is in direct contact with the boron-doped region of the silicon substrate (p− region) 310.

In an alternate configuration, n+ region 312 does not exist on the rear surface in a way that the rear passivation layer passivates p− wafer directly for instance by a floating junction induced by fixed charge in SiN layer 314.

In an embodiment, n+ region 312 is removed prior to the formation of the rear passivation layer 314. In another embodiment, n+ region 312 is not substantively formed, for instance, by covering the rear surface during the diffusion process to form the front phosphorous diffusion layer 320. For instance, the back-to-back configuration described in US2010/167510 can be used. In case the n+ region 312 is removed, the rear passivation layer 314 is in direct contact with the boron doped region 310 of the silicon substrate. The rear p+ diffusion 311 area prevents the direct contact of the rear metal electrode with the interface between the rear passivation layer 314 and the boron-doped region 310 of the silicon substrate.

Figure 4A:
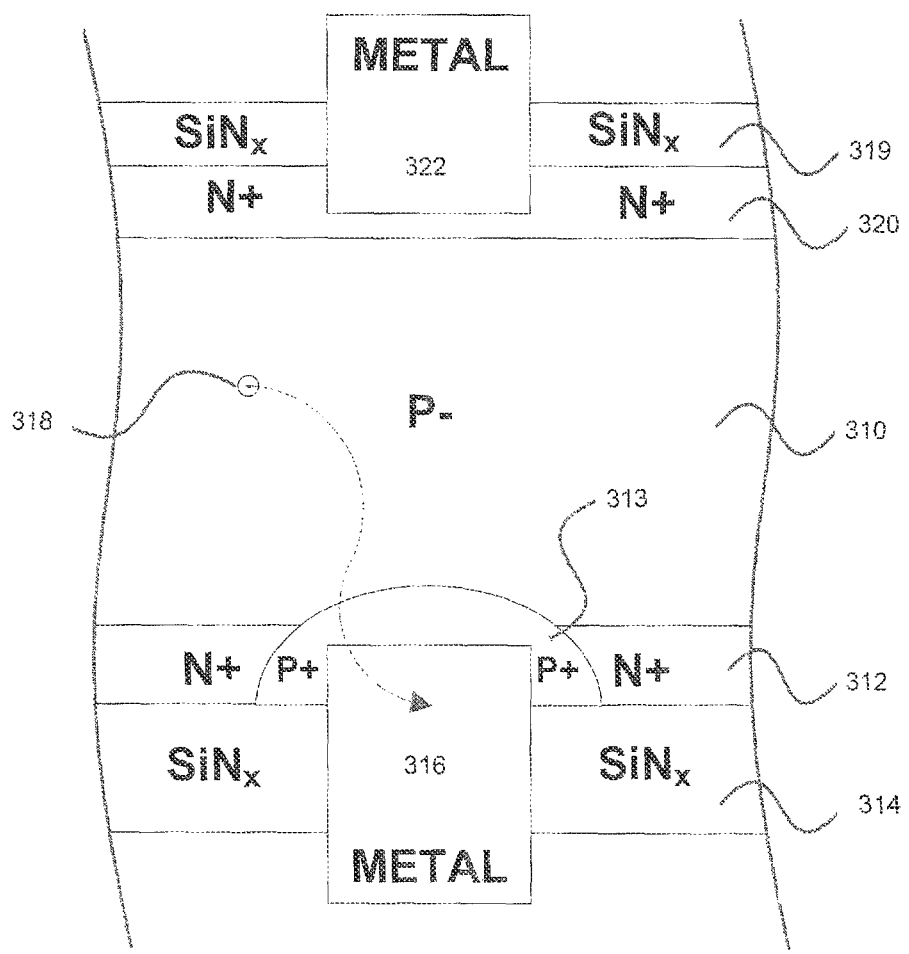
Figure 4B:
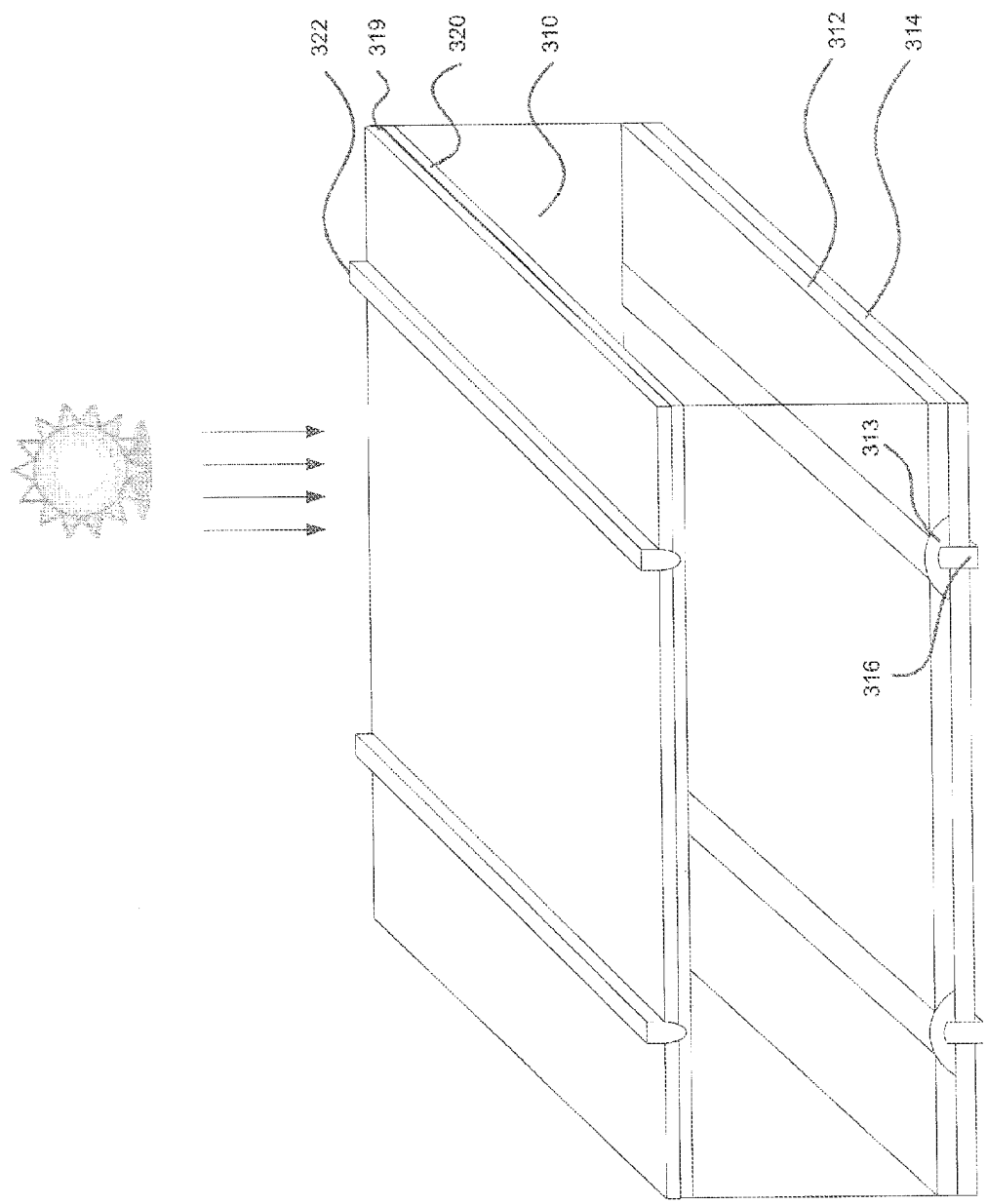
FIG. 4B shows a simplified isometric projection of the front contact solar cell.

Referring now to FIGS. 4A-B, in an alternate configuration, a set of diagrams is shown of a front contact solar cell in which a set of reduced area rear contacts are in contact with a p+ region that is diffused into a p− substrate, in accordance with the invention. FIG. 4A shows a simplified 2-D lateral diagram of the front contact solar cell, whereas FIG. 4B shows a simplified isometric projection of the front contact solar cell. In this configuration, the rear p+ diffusion area 313 is formed between the rear metal electrode and the boron-doped region of the silicon substrate and the rear metal electrode on the rear surface is not in direct contact with the boron-doped region of the silicon substrate.

FIGS. 5A-F illustrate a method for manufacturing a front-contact solar cell with a rear floating junction in which an ink (typically paste) containing a p-type dopant is deposited prior to a phosphorous diffusion, in accordance with the invention.

Figure 5A:
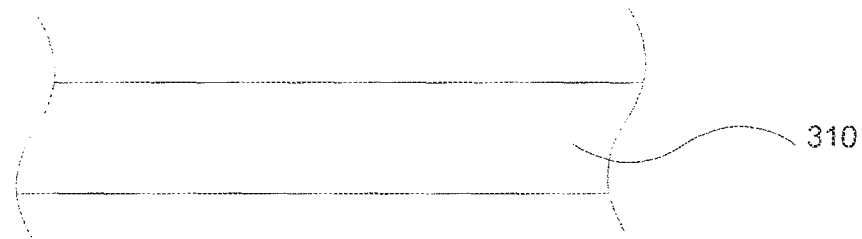
FIGS. 5A-I illustrate a method for manufacturing a front-contact solar cell with a rear floating junction in which an ink (typically paste) containing a p-type dopant is deposited prior to a phosphorous diffusion, in accordance with the invention.

Initially in FIG. 5A, silicon substrate 310, typically p-type silicon wafer doped with boron atoms, is textured to minimize light reflection and to remove saw damage. In one configuration, an alkaline texturing mixture (based on potassium or sodium hydroxide) is used in order to yield random pyramid surfaces. p-type silicon substrate 310 is then cleaned to substantially remove surface contaminants that may degrade solar cell performance. In one configuration, p-type silicon substrate 310 is first exposed to hydrochloric acid (HCl), and then exposed to hydrofluoric acid (HF) or a mixture of RF and HCl.

Figure 5B:
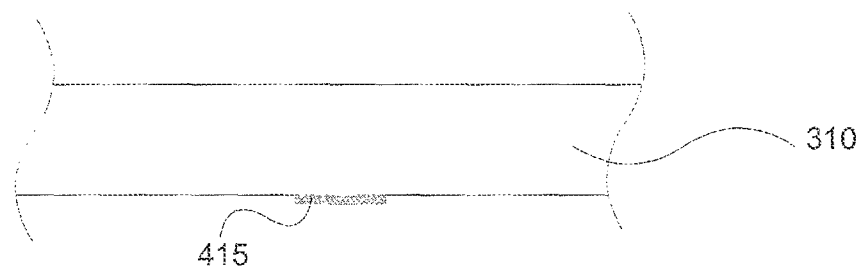

Next in FIG. 5B, the ink containing a p-type dopant 415 is deposited on the rear surface of the p-type silicon substrate 310 in a pattern (such as an H-bar pattern with busbars and fingers, or an array of dots) that will generally match subsequently deposited reduced area rear metal electrodes 316. In one H-bar configuration, finger spacing is between about 500 μm and about 1500 μm, and finger width is between about 100 μm and about 400 μm. In one dot array configuration, the spacing between the dots is between about 500 μm and about 1500 μm, and the radius of each dot is between 50 μm and about 400 μm.

There are several methods of depositing the ink containing a p-type dopant. Screen printing, in particular, is beneficial for the deposition of the paste since it is commonly used in solar cell manufacturing for the deposition of front and rear metal pastes. For the better printing efficiency and performance, the ink is preferred to be a non-Newtonian or shear-thinning fluid.

Non-Newtonian fluid refers to a fluid that has flow properties that are not described by a single constant value of viscosity, or resistance to flow. Shear thinning refers to a fluid which has a viscosity that decreases with increasing rate of shear. In general, shear thinning behavior is observed in colloidal suspensions, where the weak hydrostatic and electrostatic interaction between particles and their surface groups tends to increase viscosity in non-dynamic force regimes. The addition of a relatively small shear force overcomes the hydrostatic interaction and thus tends to reduce the viscosity of the fluid.

Consequently, the viscosity of the paste is preferred to be relatively tow at high shear rates in order to pass through a screen pattern, but is also preferred to be relatively high prior to and after deposition (at low or zero shear rates), such that the paste will not run through the screen or on the substrate surface respectively.

The p-type dopant may contain an element in group 13, including boron, aluminum, gallium, indium, thallium and ununtrium. In an embodiment, the p-type dopant is selected from the group consisting of boron-containing material, aluminum-containing material, gallium-containing material and indium-containing material.

In an embodiment, the ink contains a boron-containing material as the p-type dopant. The boron-containing material includes, but not limited to, boron (B), boron nitride (BN), boron oxide ($B_2O_3$), boric acid ($B(OH)_3$), boron carbide ($B_4C$), boron silicide ($B_2Si$, $B_3Si$, $B_4Si$, $B_6Si$), boron-doped group IV nanoparticles (such as nc-Si:B), aluminum boride ($AlB_2$), barium boride ($BaB_6$), calcium boride ($CaB_6$), cerium boride ($CeB_6$), chromium boride (CrB), cobalt boride ($Co_2B$—$Co_3B$), dysprosium boride ($DyB_4$, $DyB_6$), erbium boride ($ErB_4$), europium boride ($EuB_6$), gadolinium boride ($GdB_6$), hafnium boride ($HfB_2$), holmium boride ($HoB_4$), iron boride ($Fe_2B$), lanthanum boride ($LaB_6$), lutetium boride ($LuB_4$), magnesium boride ($MgB_2$), manganese boride (MnB, $MnB_2$), molybdenum boride (MoB), neodymium boride ($NdB_6$), nickel boride (NiB), niobium boride ($NbB_2$), praseodymium boride ($PrB_6$), rhenium boride ($Re_7B_3$), samarium boride ($SmB_6$), scandium boride ($ScB_2$), strontium boride ($SrB_6$), tantalum boride ($TaB_2$), terbium boride ($TbB_6$), thulium boride ($TmB_4$), titanium boride ($TiB_2$), tungsten boride (WB, $W_2B$, $W_2B_5$), vanadium boride ($VB_2$), ytterbium boride ($YbB_6$), and zirconium boride ($ZrB_2$, $ZrB_{12}$).

The purity of the boron-containing material is not limited. The purity of the boron-containing material is more than 95 mol % in an embodiment, more than 97 mol % in another embodiment, and more than 99 mol % in another embodiment. Two or more types of the boron-containing material can be used in mixture.

The p-type dopant is between 0.5 and 20 wt % in an embodiment, and between 1 and 10 wt % in another embodiment, based on the total weight of the ink.

A ceramic particle may be included in the ink. During the high temperature diffusion process, boron is allowed to diffuse into the substrate, while the diffusion of ambient phosphorous may be blocked or substantially reduced by the ceramic material. In an embodiment, the ceramic particle is selected in terms of compatibility with the silicon substrate. Some of the oxide materials in contact with silicon at an elevated temperature may get reduced introducing impurities into the wafer.

The ceramic particle include, but not limited to, SiN, $SiO_2$, SiC, $TiO_2$, $Al_2O_3$, MgO, CaO, $Li_2O$, BeO, SrO, $Sc_2O_3$, $Y_2O_3$, $La_2O_3$, $CeO_2$, $Ce_2O_3$, $Pr_2O_3$, $Nd_2O_3$, $Sm_2O_3$, EuO, $Gd_2O_3$, $Ta_2O_5$, $Tb_2O_3$, $Dy_2O_3$, $Ho_2O_3$, $Er_2O_3$, $Tm_2O_3$, $Yb_2O_3$, $Lu_2O_3$, $ThO_2$, $UO_2$, $ZrO_2$ and $HfO_2$. In an embodiment, the ceramic particle is selected from the group consisting of titanium oxide ($TiO_2$), aluminum oxide ($Al_2O_3$), magnesium oxide (MgO), tantalum oxide ($Ta_2O_5$), and zirconium oxide (ZrO2), and combinations thereof.

The purity of the ceramic particle is not limited. The purity of the ceramic particle is more than 95 mol % in an embodiment, more than 97 mol % in another embodiment, and more than 99 mol % in another embodiment. Two or more types of the ceramic particle can be used in mixture.

In an alternate configuration, the particle surface of the ceramic particle may be treated with a ligand or capping agent in order to disperse in a set of solvents and optimize shear thinning behavior. In general, a capping agent or ligand is a set of atoms or groups of atoms bound to a "central atom" in a polyatomic molecular entity. The capping agent is selected for some property or function not possessed by the underlying surface to which it may be attached.

For the selection and modification of the ceramic particle, publicly available paper such as K. J. Hubbard and D. C. Schlom, *Thermodynamic stability of binary metal oxides in contact with Silicon*, J. Mater. Research, v 11(11), 1996) and prior patent application such as U.S. Utility patent application Ser. No. 13/099,794 filed on May 3, 2011 can be referred to.

The ceramic particle is between 3 and 50 wt % in an embodiment, and between 5 and 30 wt % in another embodiment, based on the total weight of the ink.

A polymer binder may be included in the ink in order to optimize viscoelastic behavior of the paste for screen printing. The polymer binder includes, but is not limited to, polyacrylates, polyacetals and their derivatives, polyvinyls, a cellulose (including its ethers and esters), and copolymers thereof. Two or more types of the polymer binder can be used in mixture.

The polymer binder is between 0.5 and 3 wt % in an embodiment, and between 0.75 and 2 wt % in another embodiment, based on the total weight of the ink.

The component of the ink can be dispersed in a solvent, such as alcohols, aldehydes, ketones, carboxylic acids, esters, amines, organosiloxanes, halogenated hydrocarbons, and other hydrocarbon solvents. In addition, the set of solvents may be mixed in order to optimize physical characteristics such as viscosity, density, polarity, etc.

Figure 5C:
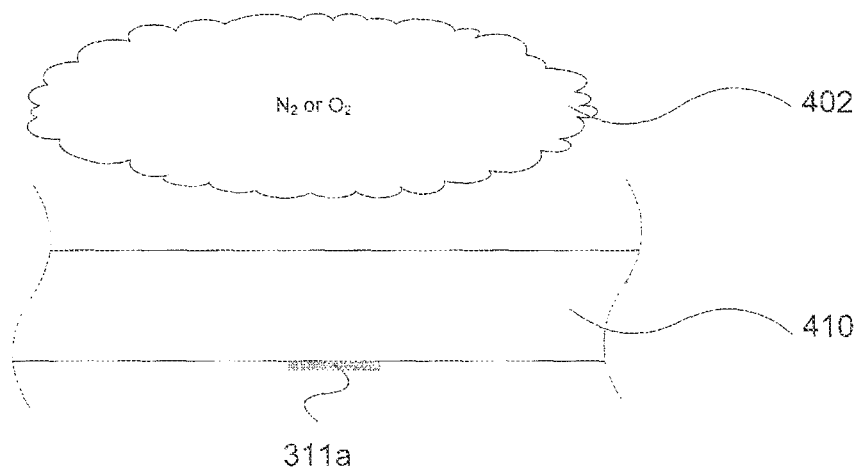

Next in FIG. 5C, in order to remove residual solvents from the ink 415, p-type silicon substrate 310 may be heated to a certain temperature for a certain time. For example, p-type silicon substrate 310 is heated to between about 50° C. and about 450° C., for a time period of between about 30 seconds and about 10 minutes, in an ambient 402 containing oxygen and/or nitrogen. In another embodiment, the substrate is heated to between 375° C. and 425° C., for between about 30 seconds and about 1 minute. Consequently, the dried ink 311a is formed.

Figure 5D:
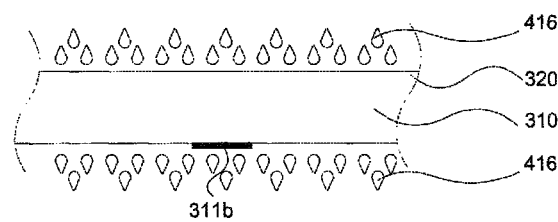

Next in FIG. 5D, pre-diffusion cleaning step may be applied to the substrate after the dried ink 311a is formed. Specifically, p-type silicon substrate 310 may be exposed to a wet cleaning mixture 416 configured to substantially remove contaminants and a native oxide that is present on the surface of the substrate, In one configuration, a 7% solution of HF with 5% HCl in de-ionized water (DIW) is used. In alternate configurations, other cleaning chemistries are used, such as HF, HCl, SC1 (a mixture of ammonium hydroxide, hydrogen peroxide ($H_2O_2$) and DIW), and SC2 (a mixture of HCl, $H_2O_2$ and DIW). 311b is a clean-processed dried ink.

Figure 5E:
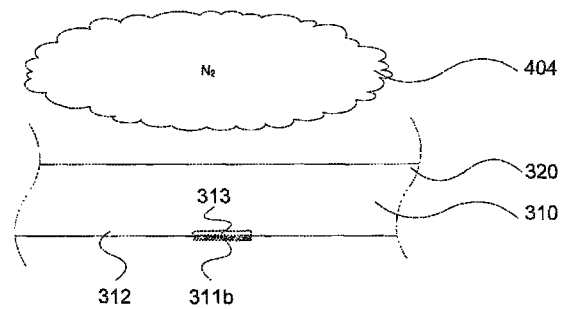

Next in FIG. 5E, p-type silicon substrate 310 is heated in an ambient to a certain temperature and for a certain time period in order to diffuse the p-type dopant into the rear surface to form a rear p+ diffusion area 311 on the rear surface. In an embodiment, p-type silicon substrate 310 is placed in an $N_2$ or oxidizing ambient 404 between about 800° C. and about 950° C. from about 10 minutes to about 120 minutes in order to diffuse the p-type dopant into p-type silicon substrate 310. In another embodiment, p-type silicon substrate 310 is exposed to a temperature between about 875° C. and about 950° C., and for between about 20 minutes and about 60 minutes. In another embodiment, the substrate is heated to between 900° C. and 925° C., for between about 40 minutes and about 60 minutes. The ambient can be nitrogen, oxygen or mixture thereof. As result of this process, a p-type doped region 311 is formed in the p-type silicon substrate 310. The heating time is between 20 minutes and 60 minutes in an embodiment, and 40 minutes and 60 minutes in another embodiment.

Figure 5F:
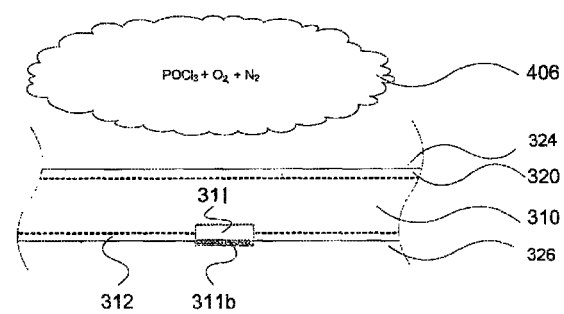

Next in FIG. 5F, p-type silicon substrate 310 is exposed to a phosphorous deposition ambient at a certain temperature for a certain time period. Consequently, a front PSG layer 324 and a front phosphorous diffusion layer 320 are formed on the front surface. In case the rear surface is also exposed to the phosphorous deposition ambient, a rear PSG layer 326 and a rear phosphorous diffusion layer 312 are formed.

Typically, $POCl_3$ gas is used as the phosphorous deposition ambient. In an embodiment, p-type silicon substrate 310 is exposed to a $POCl_3$ ambient 406 at a temperature between about 800° C. and about 900° C. and from about 10 minutes to about 30 minutes. In another embodiment, p-type silicon substrate 310 is exposed to a temperature between about 8110° C. and about 860° C., and for between about 15 minutes and about an 25 minutes. In another embodiment, the substrate is heated to between 820° C. and 850° C., for about 20 minutes.

During this step, phosphorous is further driven from the PSG layer 324, 326 into the silicon substrate. In addition, p-type doped region 311 that was previously deposited in the previous step is further driven from the dried ink 311b into substrate and phosphorous is driven from the PSG into p-type silicon substrate 310. The dried ink 311b containing a ceramic particle can release p-type dopant (typically boron) into the substrate while blocking the path of ambient n-type dopant (phosphorous) through the patterned ink regions.

Figure 5G:
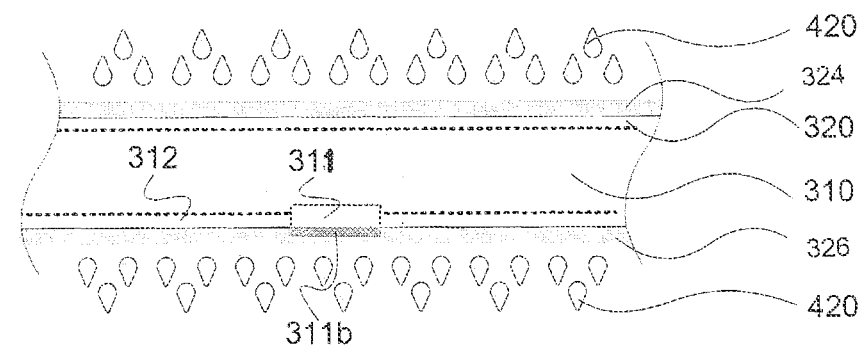

Next in FIG. 5G, the silicon substrate is exposed to an etchant for a certain time period to substantially remove the front PSG layer 324. In case the rear surface is also exposed to the phosphorous deposition ambient in the previous step, the rear PSG layer 326 is also substantively removed.

Typically, the front PSG layer 324 and the rear PSG layer 326 formed on p-type silicon substrate 310 during the $POCl_3$ deposition process may be removed by exposing the doped silicon substrate to an etchant 420, such as hydrofluoric acid (HF). The dried ink 311b can also be thinned and/or removed at this step using chemistry such as HF or mixtures of HF, HCl, $H_2O_2$ and $H_2SO_4$, $H_2O_2$ and $NH_4OH$. Alternatively to chemical removal of the ink, a spray of de-ionized water or an ultrasonic bath can also be used to remove residual dopant-containing ink.

Figure 10:
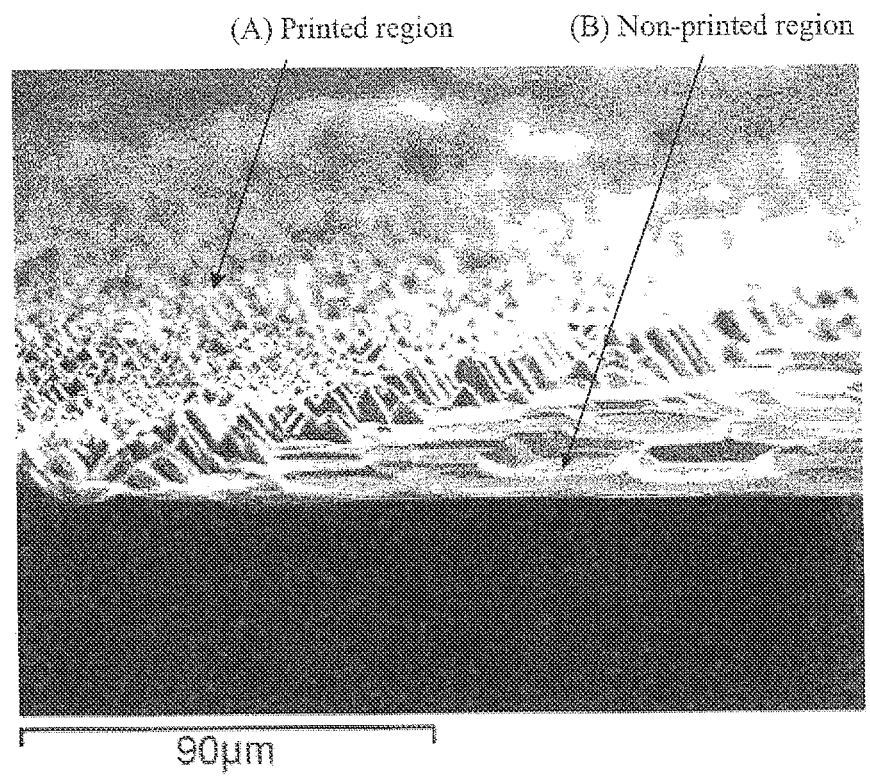
FIG. 10 is a SEM image of the sample after selective etching.

Optionally after the diffusion, a process may be used to selectively remove the silicon on the rear (ink printed) side of the solar cell, as shown in FIG. 10. In an embodiment, the silicon in a part of the rear phosphorous diffusion layer where the ink was not deposited is selectively removed for between 0.05 and 5 μm. In this case an HF-based chemistry may be used to first etch the PSG from the rear side of the substrate. This removal may be selective to the rear side (for example using a RENA InOxSide tool where the wafers are floated on an acidic chemistry whereby silicon etching happens only on the back-side of the wafer) or remove the PSG from both sides (e.g. the RENA InOx tool). After removal of the PSG an etch solution can be used to selectively etch silicon on the rear side from the non-ink printed regions. This may be achieved using solutions of KOH, NaOH, TMAH and IPA, for example 25% KOH, 2% IPA at between 45 C and 65 C for 1 to 30 minutes. This etch can be designed to achieve selectivity to the heavily p-type doped areas as given by the etch selectivity chart published in "Highly Selective KOH-Based Etchant for Boron-Doped Silicon Structures" by E. Bassous and A. C. Lamberti, IBM Research Division, Thomas J. Watson Research Center, Yorktown Heights, N.Y. 10598, USA. Microelectronic Engineering 9 (1989) 167-170. Additionally the boron ink may be designed to further mask the silicon surface during the etching process by creating a barrier between the silicon and the etch solution. By selectively etching the rear side the resulting solar cell will have enhanced reflection at the rear and reduced recombination due to the reduction in surface area. This step can also be used to provide isolation of the front-side emitter to the rear electrodes, thus avoiding shunting of the front junction during the final contact formation step.

Figure 5H:
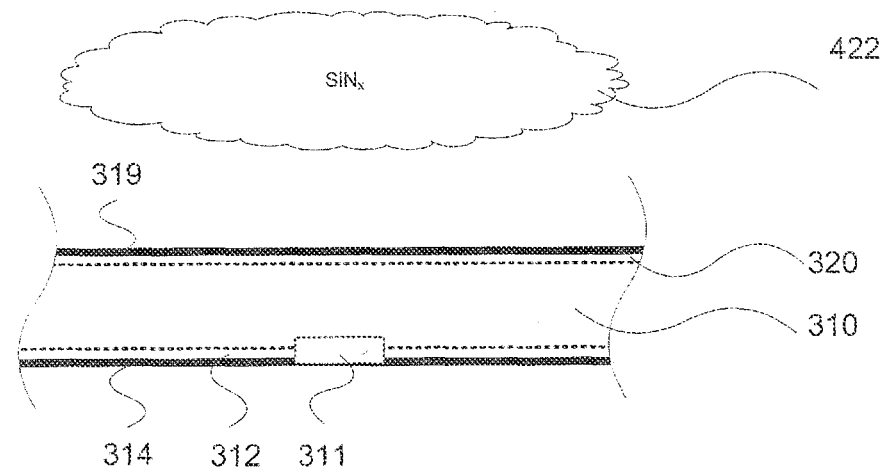

Next in FIG. 5H, a front anti-reflective layer 319 and a rear passivation layer 314 are deposited. In an embodiment, a front $SiN_x$ layer 319 and a rear $SiN_x$ layer 314 are deposited using a plasma enhanced chemical vapor deposition (PECVD) process. The thickness of the front SiNx, in an embodiment, may be around 80 nm with a refractive index of around 2.0-2.1 such that a good surface passivation and anti-reflective properties can be provided. Backside silicon nitride may have a higher RI of up to 2.4 in order to utilize best surface passivation properties of the silicon nitride film.

Figure 5I:
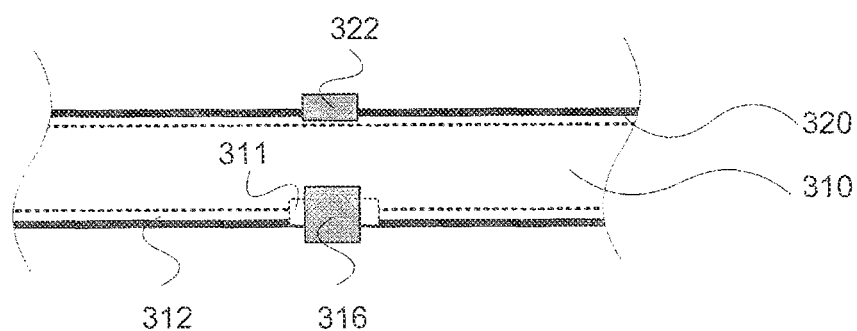

Next in FIG. 5I, a front metal electrode 322 in ohmic contact with the front phosphorous diffusion layer 320 and a rear metal electrode 316 are formed.

In an embodiment, the set of front metal electrodes 322 are formed with a silver paste, comprised of Ag powder (70 to 80 wt. %), lead borosilicate glass PbO—$B_2O_3$—$SiO_2$ (1 to 10 wt %), and organic components (15 to 30 wt %). Although contact formation and current transport are not fully understood, it is believed that the glass frit plays a substantial role by etching through the barrier layer, reducing the melting point of Ag, and promoting adhesion to Si during the firing cycle. The glass frit may also act as a barrier to Ag diffusion from the paste into the emitter.

In one configuration, the set of rear metal electrodes 316 comprise aluminum paste which forms a localized BSF. In an alternate configuration, the set of rear metal electrodes 316 are formed with an Ag/Al paste. In an alternate configuration, the set of rear metal electrodes 316 may be formed in two deposition steps. A first small diameter metal pattern is deposited and then fired through rear $SiN_x$ layer 314 in order to make contact directly with p-type silicon substrate 310, or alternatively with p+ diffusion area 311 as (previously described. A small metal cross section (for instance, between 50 μm and 100 μm) will tend to minimize charge carrier recombination and thus improve efficiency. A second larger metal pattern i.e., such as a bus bar, fingers, a network of lines, or a blanket coat) is then deposited on the first in order to extract current from the solar cell.

FIGS. 6A-J illustrate a method for manufacturing a front-contact solar cell with a selective emitter on the front surface and a rear floating junction on the back surface.

Figure 6A:
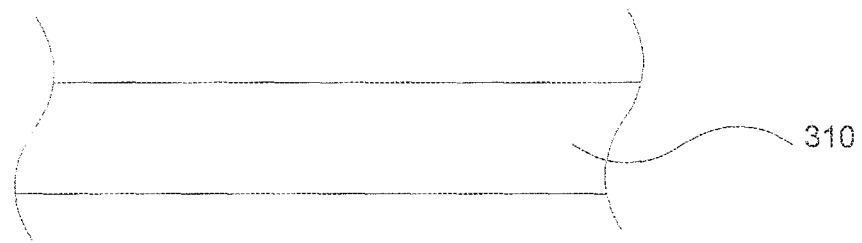
FIGS. 6A-J illustrate a method for manufacturing a front-contact solar cell with a selective emitter on the front surface and a rear floating junction on the back surface.

Initially in FIG. 6A, silicon substrate 310, typically p-type silicon wafer doped with boron atoms, is textured to minimize light reflection and to remove saw damage. In one configuration, an alkaline texturing mixture (based on potassium or sodium hydroxide) is used in order to yield random pyramid surfaces. P-type silicon substrate 310 is then cleaned to substantially remove surface contaminants that may degrade solar cell performance. In one configuration, p-type silicon substrate 310 is first exposed to hydrochloric acid (HCl), and then exposed to hydrofluoric acid (HF) or a mixture of HF and HCl.

Figure 6B:
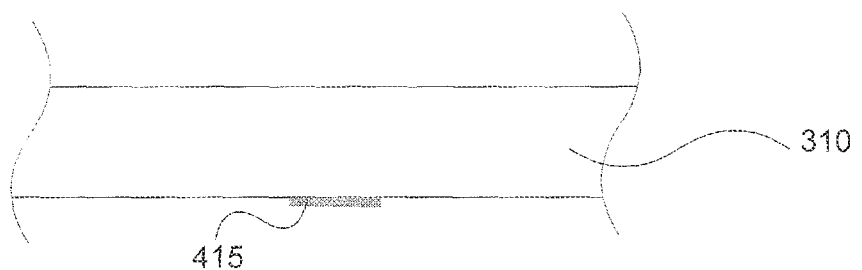

Next in FIG. 6B, the ink containing up-type dopant 415 is deposited on the rear surface of the p-type silicon substrate 310 in a pattern (such as an H-bar pattern with busbars and fingers, or an array of dots) that will generally match subsequently deposited reduced area rear metal electrodes 316. In one H-bar configuration, finger spacing is between about 500 µm and about 1500 µm, and finger width between about 100 µm and about 400 µm. In one dot array configuration, the spacing between the dots is between about 500 µm and about 1500 µm, and the radius of each dot is between 50 µm and about 400 µm. With regard to the ink containing a p-type dopant, the aforementioned description can be referred to.

Figure 6C:
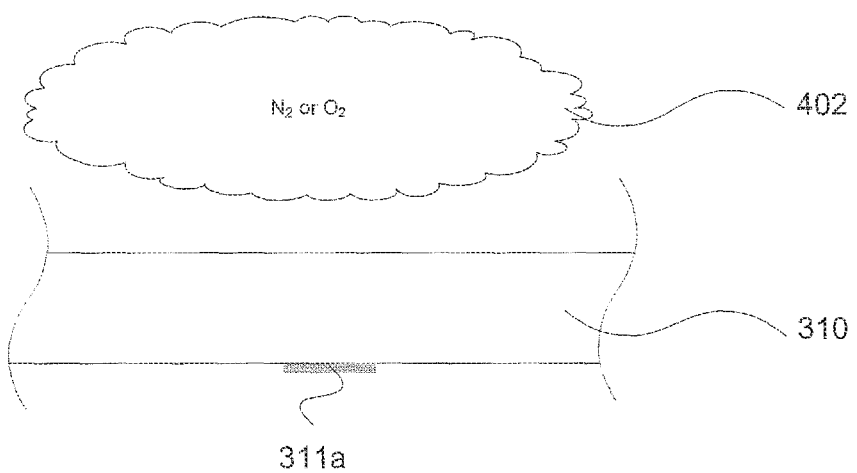

Next in FIG. 6C, in order to remove residual solvents from the ink 415, p-type silicon substrate 310 may be heated to a certain temperature for a certain time. For example, p-type silicon substrate 310 is heated to between about 50° C. and about 450° C., for a time period of between about 30 seconds and about 10 minutes, in an ambient 402 containing oxygen and/or nitrogen. In another embodiment, the substrate is heated to between 375° C. and 425° C., for between about 30 seconds and about 1 minute. Consequently, the dried ink 311$a$ is formed.

Figure 6D:
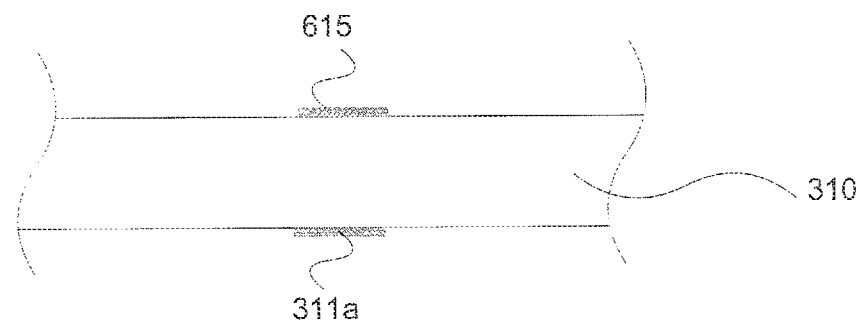

Next in FIG. 6D, the p-type silicon substrate is printed (e.g. screen print, inkjet print) with silicon-containing nanoparticle ink 615 in a pattern that will match subsequent deposition of front metal electrode. For example, this could be an H-bar configuration with 2 or 3 busbars and a set of perpendicular fingers spaced between 1 and 3 mm apart. After ink printing, to reprove residual solvents from the ink, the substrates are exposed to either an inert ($N_2$) or oxidizing ambient, for example, at a temperature between 100 and 300 for a time between 30 seconds and 2 minutes.

Figure 6E:
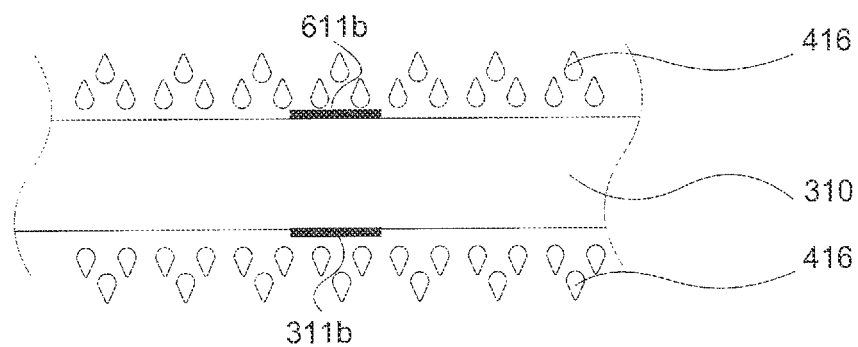

Next in FIG. 6E, pre-diffusion cleaning step may be applied to the substrate. Specifically, p-type silicon substrate 310 may be exposed to a wet cleaning mixture 416 configured to substantially remove contaminants and a native oxide that is present on the surface of the substrate. In one configuration, a 7% solution of HF with 5% HCl in de-ionized water (DIW) is used. In alternate configurations, other cleaning chemistries are used, such as HF, HCl, SC1 (a mixture of ammonium hydroxide, hydrogen peroxide ($H_2O_2$) and DIW), and SC2 (a mixture of HCl, $H_2O_2$ and DIW), 311$b$ is a clean-processed dried p-type ink. 611$b$ is a clean-processed dried silicon-containing nanoparticle ink. The silicon-containing nanoparticle ink 611$b$ is designed such that it allows heavier phosphorous doping in the ink-printed region than it is outside of the ink-printed region such that a selective emitter is formed. With regard to the selective emitter on the front surface, as aforementioned, known technology can be referred to, including U.S. Publication US 2011/0183504 and U.S. Publication US 2011/0003465.

Figure 6F:
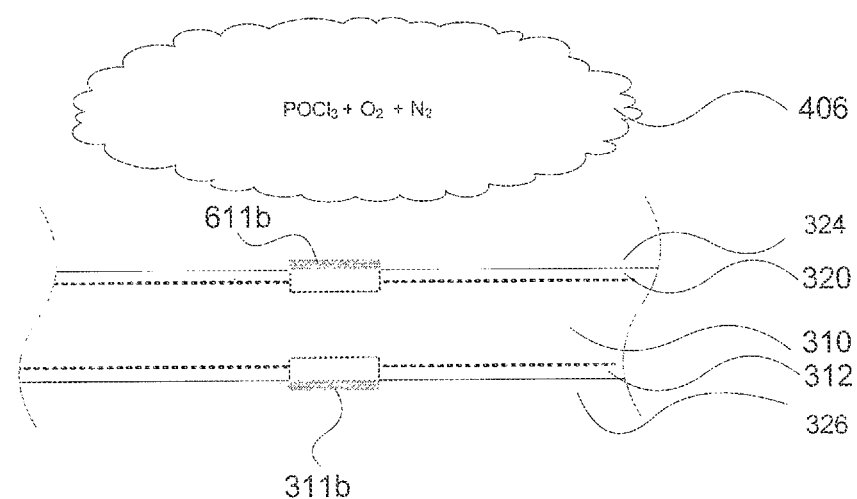

Next in FIG. 6F, p-type silicon substrate 310 is exposed to a phosphorous deposition ambient 406 at a certain temperature for a certain time period. Consequently, a front PSG layer 324 and a front phosphorous diffusion layer 320 are formed on the front surface. In case the rear surface is also exposed to the phosphorous deposition ambient, a rear PSG layer 326 and a rear phosphorous diffusion layer 312 are formed.

Typically, $POCl_3$ gas is used as the phosphorous deposition ambient. In an embodiment, p-type silicon substrate 310 is exposed to a $POCl_3$ ambient 406 at a temperature between about 780° C. and about 880° C. and from about 10 minutes to about 30 minutes. In another embodiment, p-type silicon substrate 310 is exposed to a temperature between about 800° C. and about 860° C., and for between about 15 minutes and about an 25 minutes. In another embodiment, the substrate is heated to between 800° C. and 840° C., for about 20 minutes.

Figure 6G:
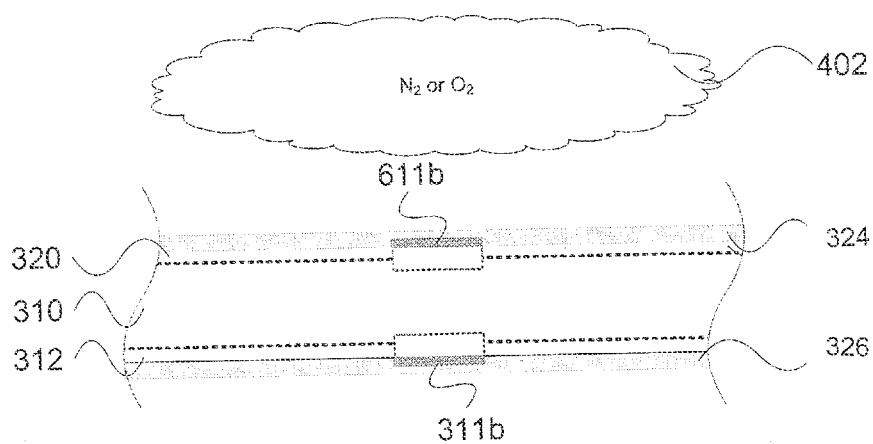

Next in FIG. 6G, the substrate may be exposed to a certain temperature for a certain time in order to drive phosphorous into the wafer in the regions where PSG is in contact with the substrate and to drive boron into the wafer where rear p+ diffusion area has been formed. The substrate is heated to between 850° C. to 950° C. in an embodiment, to between 860° C. and 900° C. in another embodiment, in an oxygen or nitrogen ambient 402. During this step, boron is further driven from the ink 311$b$ into the substrate and phosphorous is further driven from the PSG layer 324, 326 into the silicon substrate. The p-dopant ink is designed such that it allows a flow of boron into the substrate while blocking the path of phosphorous through the ink printed regions, thus creating localized regions of p-type doping, 311, where ink was printed.

Figure 6H:
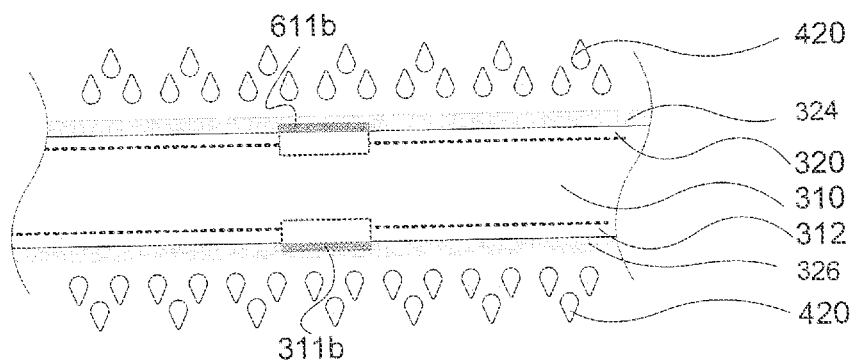

Next in FIG. 6H, the silicon substrate is exposed to an etchant for a certain time period to substantially remove the front PSG layer 324. In case the rear surface is also exposed to the phosphorous deposition ambient in the previous step, the rear PSG layer 326 is also substantively removed.

Typically, the front PSG layer 324 and the rear PSG layer 326 formed on p-type silicon substrate 310 during the $POCl_3$ deposition process may be removed by exposing the doped silicon substrate to an etchant 420, such as hydrofluoric acid (HF). The ink layers 311$b$ and 611$b$ can also be thinned and/or removed at this step using chemistry such as HF or mixtures of HF, HCl, $H_2O_2$ and $H_2SO_4$, $H_2O_2$ and $NH_4OH$. Alternatively to chemical removal of the ink, a spray of DI water or an ultrasonic bath can also be used to remove residual dopant-containing ink.

Optionally after the diffusion, a process may be used to selectively etch the silicon on the rear (ink printed) side of the solar cell, as described before and shown in FIG. 10.

Figure 6I:
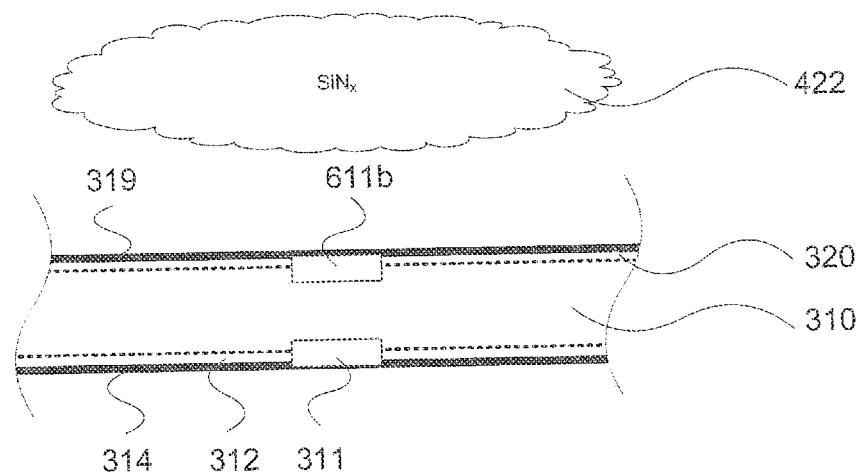

Next in FIG. 6I, a front anti-reflective layer 319 and a rear passivation layer 314 are deposited. In an embodiment, a front $SiN_x$ layer 319 and a rear $SiN_x$ layer 314 are deposited using a plasma enhanced chemical vapor deposition (PECVD) process. The thickness of the front SiNx is, in an embodiment, around 80 nm with a refractive index of around 2.0-2.1 such that a good surface passivation and anti-reflective properties can be provided. Backside silicon nitride ma have a higher RI of up to 2.4 in order to utilize best surface passivation properties of the silicon nitride film.

Figure 6J:
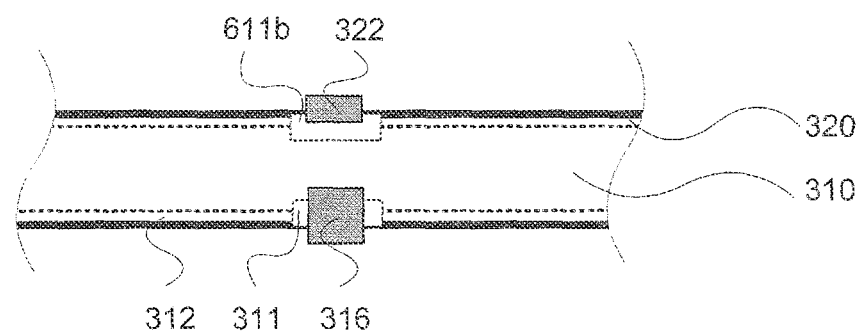

Next in FIG. 6J, a front metal electrode 322 in ohmic contact with the front phosphorous diffusion layer 320 and a rear metal electrode 316 are formed. The set of front metal electrodes 322 and the set of rear metal electrodes 316 can be comprised of the composition described before.

Experiment 1

To demonstrate the potential for efficiency improvement of the process described above, solar cells were fabricated with three different rear contact schemes and the relevant parameters were characterized. The first set (A) of cells used a boron doped ink to create localized rear contacts where the rear metal electrode is surrounded with the rear p+ diffusion area as described above. As a reference for this process, a second set (B) was made using the same process but with no ink (cf. FIG. 2) and a third set (C) was made with standard cell rear surface processing techniques (i.e. a full area AlBST as shown in FIG. 1).

All wafers were first etched in a solution of $HF:HNO_3$ to remove residual saw damage and then textured in a KOH solution to form random pyramid texture for enhanced light trapping. After texturing, the substrates were cleaned in a mixture of HF:HCl to remove residual contaminants from the surface.

Wafers from set A were then printed with an ink containing a boron-containing material and a ceramic particle. The pattern used comprised of an H-bar with two busbars each 1.7 mm wide and a set of fingers perpendicular to the busbars with a spacing of 1 mm and a finger width of approximately 300 μm. After printing, the wafers were baked in an inline belt furnace with a peak temperature of 400° C. and a time of approximately 45 seconds. The wafers from set B and C received no ink print.

Next the wafers from the first two sets were cleaned in a solution of HF:HCl (7% HF and 5% HCl in DI water) and were then loaded into a quartz diffusion furnace at a temperature of 800° C. in a nitrogen ambient. After loading, the furnace temperature was increased to 925° C. for 1 hour to drive the boron from the ink into the substrate.

Next, the furnace was ramped down to approximately 850° C. and $POCl_3$ gas was flowed with an ambient containing $N_2$ and $O_2$ for 20 minutes. After phosphorous diffusion, the furnace was ramped down in $N_2$ ambient to 800° C. and unloaded. The samples from the third set received a similar emitter diffusion hut without the initial high temperature drive in step.

After diffusion, the PSG and residual ink was removed from the samples and the surface was prepared for silicon nitride deposition using a series of chemical cleans. Silicon nitride was deposited on the front side of all sets using a PECVD tool. The front nitride used had an RI of about 2.08 and a thickness of approximately 100 nm as measured on a polished Si wafer. The first and second set had an additional nitride deposition on the rear surface. This nitride had an RI of ~2.3 and a thickness of approximately 40 nm.

Front metal paste was screen printed onto all three sets. The paste used was a standard Ag paste designed to fire through the nitride layer and contact the heavily doped silicon underneath (front phosphorous diffusion layer). On the first two sets (which have a anti-reflective layer on the rear surface), a Ag:Al paste was printed on the rear surface. For the first set this print was aligned to the previously deposited ink such that all of the Ag:Al paste sat within the area covered by the ink. For the third set, it was necessary to use two screen print steps to form the rear contact. In the first step, a Ag:Al paste was printed in the busbar regions, the second print was a blanket coat of Al paste with openings in the regions of the previously printed Ag:Al paste. After each print step, the metal paste was baked at a low temperature (~200° C.) to remove solvent. After all print steps, the cells were fired using a profile known to give good ohmic contact between the front side Ag and the emitter (front phosphorous diffusion layer). The peak temperature used for the third set needed to be 50° C. hotter due to the presence of the thick layer of Al on the entire rear surface. After firing, the cells from the third set were noticeably bowed (warped) while the cells from the first 2 sets remained flat. After firing, the cells were edge isolated using a laser to cut away the edge regions.

Figure 7:
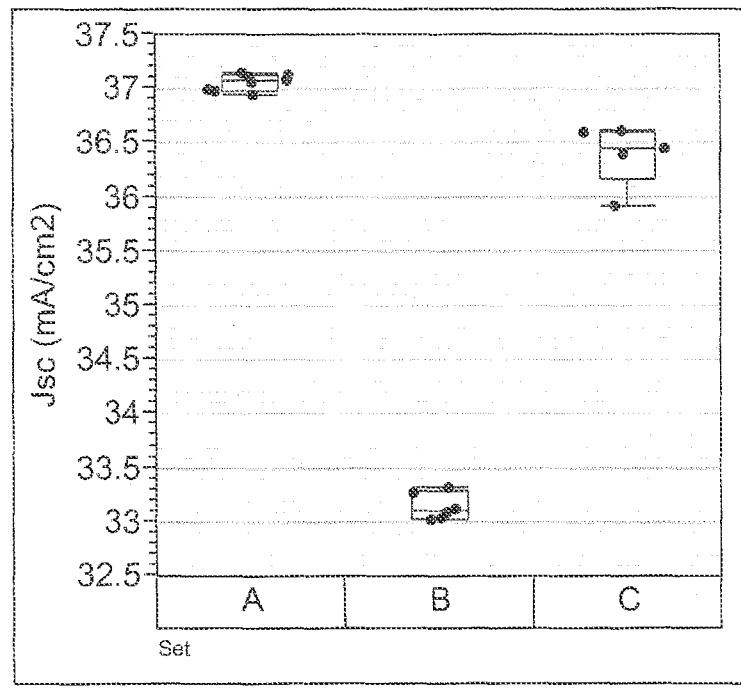
FIG. 7 shows short circuit current density measured on cells made with boron doped ink (set A), with no boron doped ink (set B) and with standard full area aluminum BSF (set C).

FIG. 7 shows Jsc measured on the cells from the three sets (A) with localized BSF formed using ink wherein the rear metal electrode is surrounded with the p+ diffusion area, (B) with localized rear contact but no boron ink and (C) reference cells with full area Al BSF.

The superior ability of the first set (A) is shown in the FIG. 7. In FIG. 7, the measured Jsc of each set of cells is plotted. For the cells with localized rear contacts (first set (A) and second set (B)), this was measured with a piece of film (DuPont™ Tedlar® PVF film) behind the cell to stop unwanted stray light from getting into the rear of device and also to reflect light that has passed through the cells back into the device as would be the case in a solar cell module.

Figure 2:
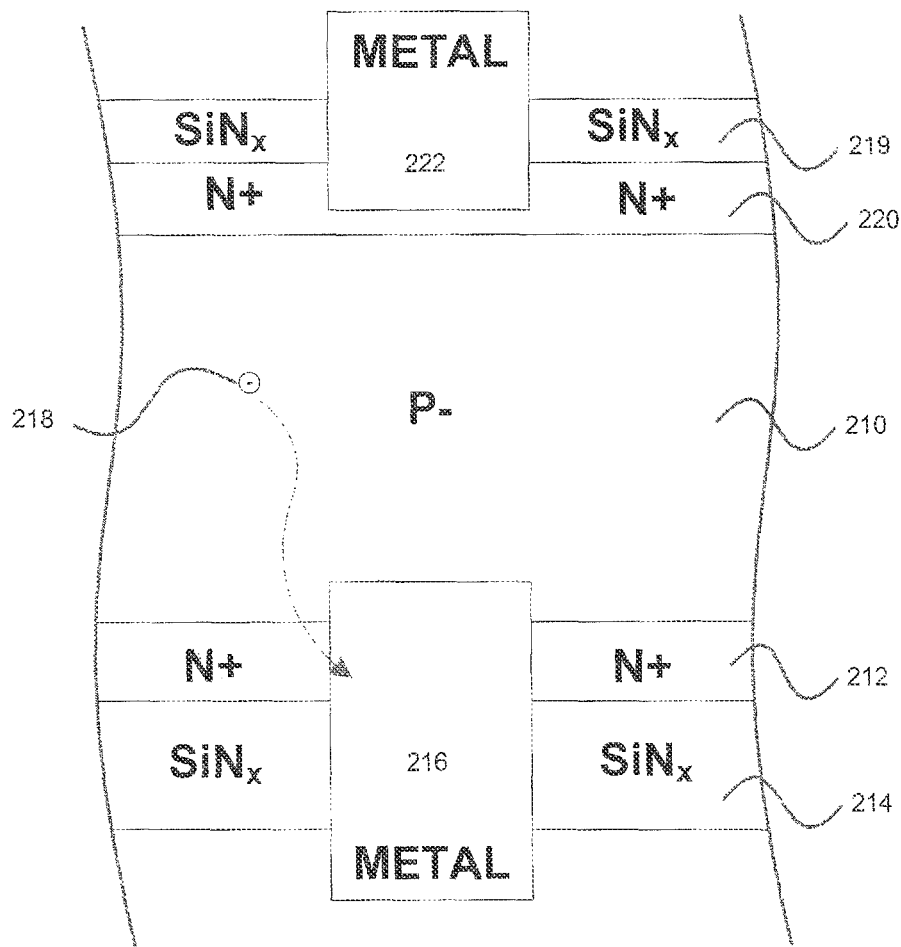
FIG. 2 shows a simplified diagram of a passivated layer/reduced area metal contact solar cell configuration with detrimental shunting.

The cells from set A, made with the boron ink, have the highest Jsc. The cells from set B have a greatly reduced Jsc, this is presumably due to the lack of a localized BSF in the region of the rear contact metal. Due to the lack of the rear p+ diffusion in the area surrounding the rear metal electrode, a shunt was formed between the boron doped substrate and the rear metal electrodes as illustrated in FIG. 2, resulting in extremely high recombination. The cells from set C are lower than those from set A. This is presumably due to the increased absorption of long wavelength light by the Al contact formed in the full area of the rear surface.

Figure 8:
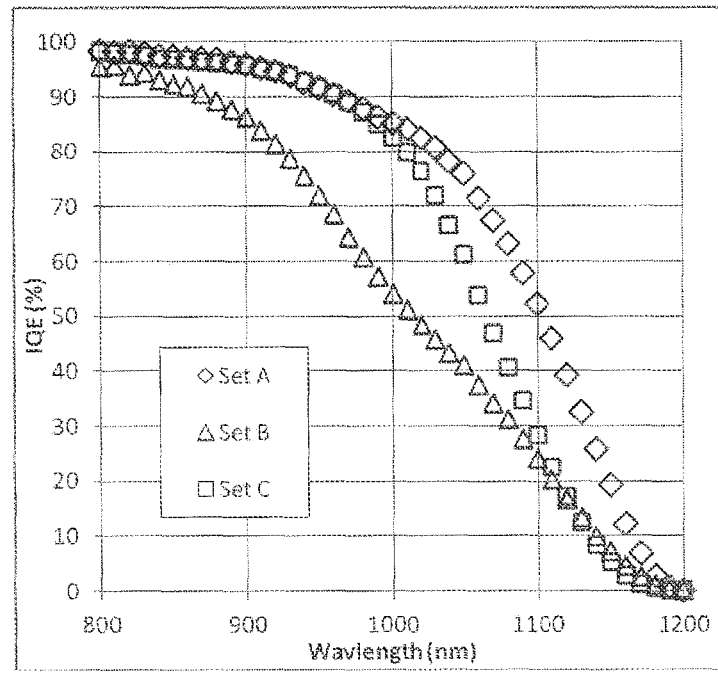
FIG. 8 shows internal quantum efficiency of devices made from set A with boron doped ink (diamonds), set B with no boron doped ink (triangles) and set C with standard full area aluminum BSF (squares).

The impact of the three rear contact schemes on the collection of long wavelength light is further demonstrated in FIG. 8. FIG. 8 shows Internal Quantum Efficiency (IQE) measured at wavelengths from 800 nm to 1200 nm for a typical sample from each of the 3 sets. The internal quantum efficiency was calculated by measuring the external quantum efficiency (with DuPont™ Tedlar® PVF film for Sets (A) and (B)) and the reflection (again with DuPont™ Tedlar® PVF film for sets (A) and (B)) and combining the results. Clearly the cell from set (A) has the highest collection percentage of long wavelength light. Set (B) is again the worst with very poor long wavelength IQE.

Experiment 2

To demonstrate the importance of boron doping for ohmic contact formation, two sets of samples were fabricated, both using Ag:Al metal paste for rear contact formation: Set A with boron-doped ink to create localized heavily p-type doped regions; Set B without boron-doped ink.

All wafers were first etched in a solution of $HF:HNO_3$ to remove residual saw damage and then textured in a KOH solution to form random pyramid texture for enhanced light trapping. After texturing the substrates were cleaned in a mixture of HF:HCl to remove residual contaminants from the surface.

Wafers from set A were then printed with an H-bar of boron containing ceramic paste. The pattern used comprised of an H-bar with two busbars each 1.7 mm wide and a set of fingers perpendicular to the busbars with a spacing of 1 mm and a finger width of approximately 300 um. After printing the wafers were baked in an inline belt furnace with a peak temperature of 400° C. and a time of approximately 45 seconds. The wafers from set B received no ink print.

Next the wafers from set A were cleaned in a solution of HF:HCl (7% HF and 5% HCl in DI water) and were then loaded into a quartz diffusion furnace at a temperature of 800° C. in a nitrogen ambient. After loading the furnace temperature was increased to 925° C. for 1 hour to drive the boron from the ink into the substrate. Next the furnace was ramped down to approximately 850° C. and $POCl_3$ gas was flowed with an ambient containing $N_2$ and $O_2$ for 20 minutes. After phosphorous diffusion the furnace was ramped down in $N_2$ ambient to 800° C. and unloaded. The samples from the set B received a similar emitter diffusion but without the initial high temperature drive in step. This process resulted in a doping under the ink on the rear side of Sample A of ~55 Ohm/sq p-type and ~50 Ohm/sq n-type on the samples from set B which had no ink.

After diffusion the PSG and residual ink was removed from the samples and the surface was prepared for silicon nitride deposition using a series of chemical cleans. Silicon nitride was deposited on the front side of all sets using a PECVD tool. The front nitride used had an RI of about 2.08 and a thickness of approximately 120 nm as measured on a polished Si wafer.

Figure 9:
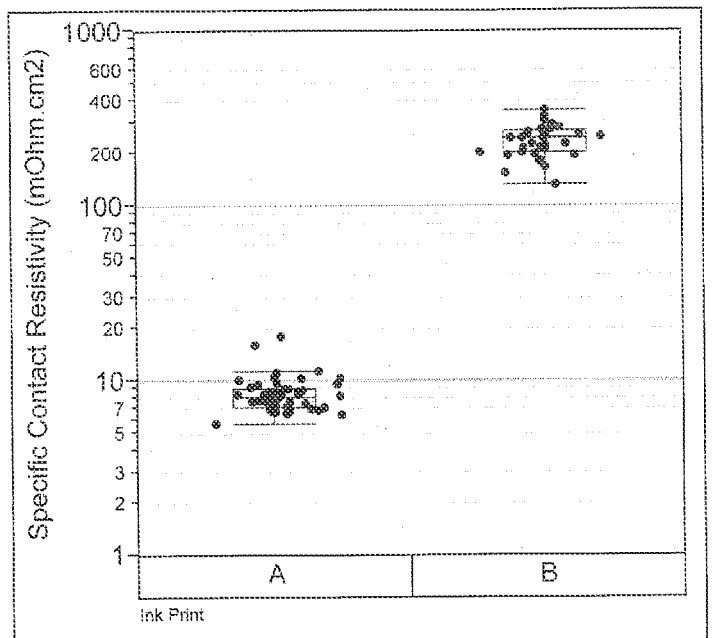
FIG. 9 shows contact resistivity, $\rho_c$, as for two configurations: using boron doped ink (Set A) and without boron-doped ink (Set B).

The cells from set A, made with the boron ink, showed lower contact resistivity as illustrated in FIG. 9.

Experiment 3

To demonstrate the inclusion of an optional rear side selective etch, solar cells were fabricated with three different rear surface texture schemes and the relevant parameters were characterized. The first set (A) of cells used a boron doped ink to create localized heavy p-type doping regions with a rear surface selective etch as described above. As a reference for this process a second set (B) was made using the same process but with no ink and a third set (C) was made with no ink and no etching.

All wafers were first etched in a solution of $HF:HNO_3$ to remove residual saw damage and then textured in a KOH solution to form random pyramid texture for enhanced light trapping. After texturing the substrates were cleaned in a mixture of HF:HCl to remove residual contaminants from the surface.

Wafers from set A were then printed with an H-bar of boron containing ceramic paste. The pattern used comprised of an H-bar with two busbars each 1.7 mm wide and a set of fingers perpendicular to the busbars with a spacing of 1 mm and a finger width of approximately 300 um, After printing the wafers were baked in an inline belt furnace with a peak temperature of 400° C. and a time of approximately 45 seconds. The wafers from set B and C received no ink print.

Next the wafers from set A were cleaned in a solution of HF:HCl. (7% HF and 5% HCl in DI water) and were then loaded into a quartz diffusion furnace at a temperature of 800° C. in a nitrogen ambient. After loading the furnace temperature was increased to 925° C. for 1 hour to drive the boron from the ink into the substrate. Next the furnace was ramped down to approximately 850° C. and $POCl_3$ gas was flowed with an ambient containing $N_2$ and $O_2$ for 20 minutes. After phosphorous diffusion the furnace was ramped down in $N_2$ ambient to 800° C. and unloaded. The samples from the second and third set received a similar emitter diffusion but without the initial high temperature drive in step.

After diffusion the PSG and residual ink was removed from the samples and the surface was prepared for silicon nitride deposition using a series of chemical cleans. Silicon nitride was deposited on the front side of all sets using a PECVD tool. The front nitride used had an RI of about 2.08 and a thickness of approximately 120 nm as measured on a polished Si wafer.

After the nitride deposition the wafers from set A and set B were cleaned in a solution of HF:HCl (7% HF and 5% HCl in DI water). They were then placed in a bath of 25% KOH with 2% IPA at 55 C for 30 minutes for etching. Set C had no etching done.

Referring now to FIG. 10, a scanning electron microscopy (SEM) image of the back-side of an etched sample from Set A is shown. This figure demonstrates excellent selectivity of the etching process with respect to the ink-printed regions: (A) the printed region shows intact pyramid texturing confirming lack of etching in the ink-printed region; (B) the adjacent non-printed region reveals a polished surface indicating strong etching in the non-printed region. SEM junction imaging (not shown) confirms presence of boron-doped diffused region in (A) and absence of diffused region in (B).

Figure 11:
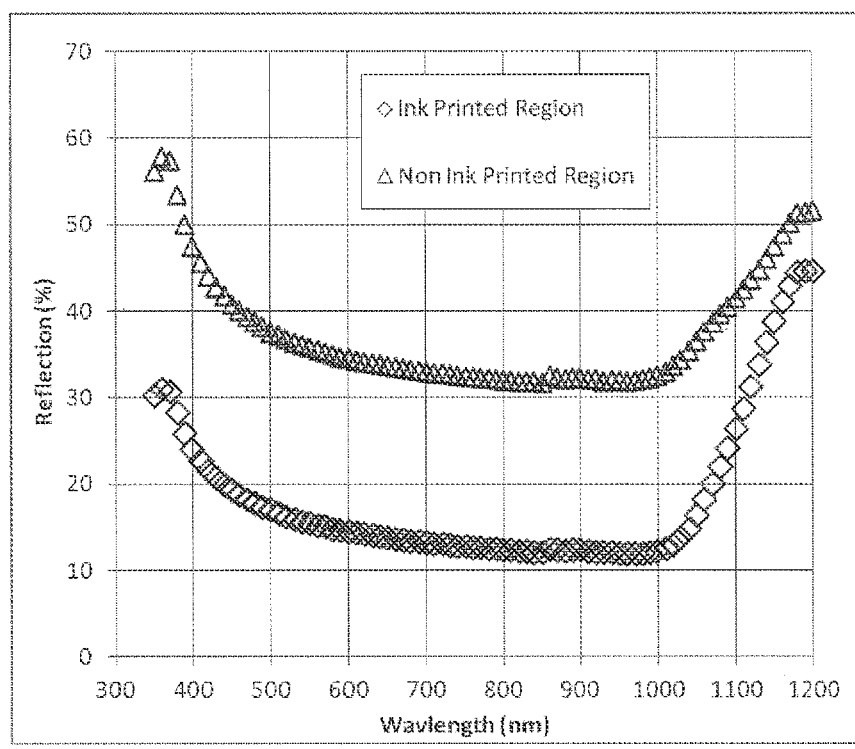
FIG. 11 shows reflection (%) as for two configurations: using boron doped ink (ink printed region) and without boron-doped ink (non ink printed region).

Referring now to FIG. 11, a graph comparing reflecting spectra of the ink region and selectively etched region is shown. This figure demonstrates a beneficial impact of selective etching on reflection properties of the wafer.

For the purposes of this disclosure and unless otherwise specified, "a" or "an" means "one or more." All patents, applications, references and publications cited herein are incorporated by reference in their entirety to the same extent as if they were individually incorporated by reference.

The invention has been described with reference to various specific and illustrative embodiments. However, it should be understood that many variations and modifications may be made while remaining within the spirit and scope of the invention.

Advantages of the invention include the production of low cost and efficient junctions for electrical devices, such as solar cells.

Having disclosed exemplary embodiments and the best mode, modifications and variations may be made to the disclosed embodiments while remaining within the subject and spirit of the invention as defined by the following claims.

What is claimed is:

1. A method of forming a high efficiency solar cell, comprising steps of:
   (a) providing a doped silicon substrate, the substrate comprising a front surface and a rear surface;
   (b) depositing an ink on the rear surface in a pattern, the ink comprising a p-type dopant and a solvent;
   (c) heating the silicon substrate in a baking ambient to a first temperature and for a first time period in order to remove residual solvent from the deposited ink;
   (d) heating the silicon substrate in a diffusion ambient to a second temperature and for a second time period in order to diffuse the p-type dopant into the rear surface to form a rear p+ diffusion area on the rear surface;
   (e) exposing the silicon substrate to a phosphorous deposition ambient at a third temperature for a third time period, wherein a front PSG layer and a front phosphorous diffusion layer are formed on the front surface, and wherein a rear PSG layer and a rear phosphorous diffusion layer are formed on the rear surface;
   (f) exposing the silicon substrate to an etchant for a third time period, wherein the front PSG layer is removed, and wherein the rear PSG layer is removed;
   (g) depositing a front anti-reflective layer on the front surface and a rear passivation layer on the rear surface; and
   (h) forming a front metal electrode on the front surface in ohmic contact with the front phosphorous diffusion layer through the front anti-reflective layer and a rear metal electrode on the rear surface through the rear passivation layer, the rear metal electrode being formed on the rear p+ diffusion area on the rear surface.

2. A method of forming a high efficiency solar cell according to claim 1, further comprising a step of removing the rear phosphorous diffusion layer, wherein a silicon in a part of the rear phosphorous diffusion layer where the ink was not deposited is selectively removed for between 0.05 and 5 μm.

3. A method of forming a high efficiency solar cell according to claim 1, wherein the rear surface is covered during the step (d) to prevent the rear surface from being exposed to the phosphorous deposition ambient.

4. A method of forming a high efficiency solar cell according to claim 1, wherein the step (e) is applied prior to the step (d).

5. A method of forming a high efficiency solar cell according to claim 1, wherein a pre-diffusion cleaning step is applied after step (c).

6. A method of forming a high efficiency solar cell according to claim 1, further comprising a step of depositing an ink comprising silicon nanoparticles dispersed in a solvent on the front surface in a pattern prior to the step (e).

7. A method of forming a high efficiency solar cell according to claim 1, wherein the p-type dopant is a boron-containing material.

8. A method of forming a high efficiency solar cell according to claim 7, wherein the boron-containing material is selected from the group consisting of boron (B), boron nitride (BN), boron oxide ($B_2O_3$), boric acid ($B(OH)_3$), boron carbide ($B_4C$), boron silicide ($B_2Si$, $B_3Si$, $B_4Si$, $B_6Si$), boron-doped group TV nanoparticles, aluminum boride ($AlB_2$), barium boride ($BaB_6$), calcium boride ($CaB_6$), cerium boride ($CeB_6$), chromium boride (CrB), cobalt boride ($Co_2B$—$Co_3B$), dysprosium boride ($DyB_4$, $DyB_6$), erbium boride ($ErB_4$), europium boride ($EuB_6$), gadolinium boride ($GdB_6$), hafnium boride ($HfB_2$), holmium boride ($HoB_4$), iron boride ($Fe_2B$), lanthanum boride ($LaB_6$), lutetium boride ($LuB_4$), magnesium boride ($MgB_2$), manganese boride (MnB, $MnB_2$), molybdenum boride (MoB), neodymium boride ($NdB_6$), nickel boride (NiB), niobium boride ($NbB_2$), praseodymium boride ($PrB_6$), rhenium boride ($Re_7B_3$), samarium boride ($SmB_6$), scandium boride ($ScB_2$), strontium boride ($SrB_6$), tantalum boride ($TaB_2$), terbium boride ($TbB_6$), thulium boride ($TmB_4$), titanium boride ($TiB_2$), tungsten boride (WB, $W_2B$, $W_2B_5$), vanadium boride ($VB_2$), ytterbium boride ($YbB_6$), and zirconium boride ($ZrB_2$, $ZrB_{12}$).

9. A method of forming a high efficiency solar cell according to claim 1, wherein the ink further comprises a ceramic particle and a polymer binder, and wherein the p-type dopant and the ceramic particle are dispersed in the solvent.

10. A method of forming a high efficiency solar cell according to claim 9, wherein the ceramic particle is selected from the group consisting of SiN, $SiO_2$, SiC, $TiO_2$, $Al_2O_3$, MgO, CaO, $Li_2O$, BeO, SrO, $Sc_2O_3$, $Y_2O_3$, $La_2O_3$, $CeO_2$, $Ce_2O_3$, $Pr_2O_3$, $Nd_2O_3$, $Sm_2O_3$, EuO, $Gd_2O_3$, $Ta_2O_5$, $Tb_2O_3$, $Dy_2O_3$, $HO_2O_3$, $Er_2O_3$, $Tm_2O_3$, $Yb_2O_3$, $Lu_2O_3$, $ThO_2$, $UO_2$, $ZrO_2$, and $HfO_2$.

11. A method of forming a high efficiency solar cell according to claim 9, wherein the p-type dopant is between 0.5 and 20 wt %, the ceramic particle is between 3 and 50 wt %, the polymer binder is between 0.5 and 3 wt %, based on the total weight of the ink.

12. A method of forming a high efficiency solar cell according to claim 11, wherein the p-type dopant is between 1 and 10 wt %, the ceramic particle is between 5 and 30 wt %, the polymer binder is between 0.75 and 2 wt %, based on the total weight of the ink.

13. A method of forming a high efficiency solar cell according to claim 1, wherein the anti-reflective layer and the rear passivation layer comprise SiNx.

14. A method of forming a high efficiency solar cell according to claim 1, wherein the second temperature is between 875° C. and 950° C., and the ambient is nitrogen, oxygen, or mixture thereof.

15. A method of forming a high efficiency solar cell according to claim 1, wherein the second time is between 20 minutes and 60 minutes.

16. A method of forming a high efficiency solar cell according to claim 1, wherein the silicon substrate is doped with boron atoms.

\* \* \* \* \*